US011203690B2

(12) United States Patent
Kainou et al.

(10) Patent No.: US 11,203,690 B2
(45) Date of Patent: Dec. 21, 2021

(54) THIN LEAF-LIKE INDIUM PARTICLES AND METHOD FOR PRODUCING SAME, GLITTER PIGMENT, AND WATER-BASED PAINT AND COATING FILM

(71) Applicant: OIKE & Co., Ltd., Kyoto (JP)

(72) Inventors: Yusuke Kainou, Kyoto (JP); Tomoe Hori, Kyoto (JP); Masashi Fujiwara, Kyoto (JP)

(73) Assignee: OIKE & Co., Ltd., Kyoto (JP)

( * ) Notice: Subject to any disclaimer, the term of this patent is extended or adjusted under 35 U.S.C. 154(b) by 164 days.

(21) Appl. No.: 16/659,745

(22) Filed: Oct. 22, 2019

(65) Prior Publication Data

US 2020/0270461 A1 Aug. 27, 2020

(30) Foreign Application Priority Data

Feb. 21, 2019 (JP) .............................. JP2019-029127

(51) Int. Cl.
*C09C 1/00* (2006.01)
*B22F 1/00* (2006.01)
(Continued)

(52) U.S. Cl.
CPC .......... *C09C 1/0018* (2013.01); *B22F 1/0018* (2013.01); *B22F 1/0062* (2013.01);
(Continued)

(58) Field of Classification Search
CPC .............. C09C 1/0018; C09C 2220/20; C09C 2210/20; C09C 2200/1058; C09C 1/0021;
(Continued)

(56) References Cited

U.S. PATENT DOCUMENTS 4,431,711 A 2/1984 Eisfeller
4,621,112 A 11/1986 Backhouse et al.
(Continued)

FOREIGN PATENT DOCUMENTS

EP 0583919 2/1994
JP 61-047771 3/1986
(Continued)

OTHER PUBLICATIONS

Chinese Patent Office, First Office Action issued in corresponding Chinese Patent Application No. 202010082160.0 dated Jan. 29, 2021.
(Continued)

*Primary Examiner* — Nathan L Van Sell
(74) *Attorney, Agent, or Firm* — Carmody Torrance Sandek & Hennessey LLP

(57) ABSTRACT

Provided are thin leaf-like indium particles having a first peak and a second peak at a greater particle diameter than a particle diameter at which the first peak appears in a volume-based particle size distribution representing a relationship between particle diameters of indium particles and ratios by volume of the indium particles at the particle diameters, wherein a volume V1 of the indium particles at the first peak and a volume V2 of the indium particles at the second peak satisfy a formula $(V1/V2) \times 100 \geq 25\%$.

9 Claims, 15 Drawing Sheets

(51) Int. Cl.
*B22F 9/12* (2006.01)
*C09D 17/00* (2006.01)
*C23C 14/14* (2006.01)
*C23C 14/24* (2006.01)

(52) U.S. Cl.
CPC .............. *B22F 9/12* (2013.01); *C09D 17/001* (2013.01); *C09D 17/006* (2013.01); *C23C 14/14* (2013.01); *C23C 14/24* (2013.01); *B22F 2001/0033* (2013.01); *B22F 2301/30* (2013.01); *C01P 2004/03* (2013.01); *C01P 2004/04* (2013.01); *C01P 2004/24* (2013.01); *C01P 2004/54* (2013.01); *C01P 2004/62* (2013.01); *C01P 2006/62* (2013.01); *C01P 2006/63* (2013.01); *C01P 2006/64* (2013.01)

(58) Field of Classification Search
CPC .. C09C 1/62; C09C 3/006; C09C 3/04; C09C 3/045; C09C 3/08; C09C 3/10; B22F 1/0018; B22F 1/0062; B22F 9/12; B22F 2001/0033; B22F 2301/30; C09D 17/001; C09D 17/006; C09D 7/70; C09D 5/36; C09D 7/62; C09D 11/037; C23C 14/14; C23C 14/24; C23C 14/26; C23C 14/0005; C23C 14/205; C23C 14/20; C01P 2004/03; C01P 2004/04; C01P 2004/24; C01P 2004/54; C01P 2004/62; C01P 2006/62; C01P 2006/63; C01P 2006/64; C01P 2004/53; C01P 2004/64

See application file for complete search history.

(56) References Cited

U.S. PATENT DOCUMENTS

| | | |
|---|---|---|
| 4,869,754 A | 9/1989 | Kawabe et al. |
| 5,540,768 A | 7/1996 | Yamamoto et al. |
| 2004/0194663 A1 | 10/2004 | Li et al. |
| 2007/0281140 A1 | 12/2007 | Haubrich |
| 2012/0040155 A1* | 2/2012 | Komatsu .............. C09D 11/322 428/204 |
| 2012/0129998 A1 | 5/2012 | Nakao et al. |
| 2014/0035995 A1 | 2/2014 | Chou et al. |

FOREIGN PATENT DOCUMENTS

| | | |
|---|---|---|
| JP | 63-054475 | 3/1988 |
| JP | 06-057171 | 3/1994 |
| JP | 07-133440 | 5/1995 |
| JP | 2003-041150 | 2/2003 |
| JP | 2004-124069 | 4/2004 |
| JP | 2004-131542 | 4/2004 |
| JP | 2005-298906 | 10/2005 |
| JP | 2005-298907 | 10/2005 |
| JP | 2011-012223 | 1/2011 |
| JP | 2013-093131 | 5/2013 |
| JP | 2016065262 | 4/2016 |

OTHER PUBLICATIONS

Office action dated Mar. 10, 2020 issued in connection with corresponding Japanese application No. JP2019-232557.

European Patent Office, Office Action issued in European Patent Application No. 19204911.2, dated Dec. 17, 2020.

European Patent Office, Extended European Search Report issued in corresponding European Patent Application No. 19204911.2, dated Dec. 19, 2019.

* cited by examiner

THIN LEAF-LIKE INDIUM PARTICLES AND METHOD FOR PRODUCING SAME, GLITTER PIGMENT, AND WATER-BASED PAINT AND COATING FILM

CROSS-REFERENCE TO RELATED APPLICATIONS

The present application claims priority under 35 U.S.C. § 119 to Japanese Patent Application No. 2019-029127 filed Feb. 21, 2019. The contents of which are incorporated herein by reference in their entirety.

BACKGROUND OF THE INVENTION

Field of the Invention

The present invention relates to thin leaf-like indium particles and a method for producing the same, a glitter pigment, and a water-based paint and a coating film.

Description of the Related Art

In recent years, there has been a growing interest in environmental issues, and attention has been paid to low-pollutive water-based paints and inks that are free of organic solvents. Along with a remarkable technological progress in water-based paints and inks, water-based paints and water-based inks have also been becoming able to realize a luxurious finish appearance that hitherto has been achieved only with solvent paints and inks.

Use for, for example, interior and exterior painting of automobiles is assumed for such water-based paints, and use as inks for, for example, gravure printing, offset printing, and inkjet printing is assumed for such water-based inks.

Meanwhile, there is a case of imparting a metallic gloss to paints and printing inks in order to improve their designing property. For such a case, a method of adding glitter pigments in paints and inks to impart a metallic designing property has been already known.

However, when a metal pigment is used as base particles having a metallic appearance, particularly when aluminum particles are used as the metal pigment, there is a problem that aluminum particles blended in a water-based paint may undergo reaction with water in the paint, to blacken or emit a hydrogen gas, to thereby degrade storage stability of the water-based paint.

In order to overcome the problem of storage stability degradation (i.e., water resistance degradation) that occurs in use in a water-based paint, for example, there have been proposed various techniques such as methods of treating a metal pigment with a phosphoric acid or phosphoric acid ester-based additive (for example, see Japanese Patent Application Laid-Open (JP-A) Nos. 63-054475, 61-047771, and 07-133440), a method of treating a metal pigment with a Mo (molybdenum) compound (for example, see JP-A No. 06-057171), and methods of coating a metal pigment with an oxide coating film such as silica (for example, see JP-A Nos. 2003-041150, 2004-131542, and 2004-124069).

However, these existing techniques have not reached a level of sufficiently satisfying storage stability of a water-based paint and accompanying humidity resistance of a coating film. As regards a designing property, the existing techniques also have a problem that organic components for surface treatment have effects of changing shapes of the glitter pigment or degrading the aspect ratio of the glitter pigment (aspect ratio: a shape factor obtained by dividing an average particle diameter by an average thickness), to thereby increase diffusely reflected light components and degrade a metallic designing property.

Moreover, for example, it has been proposed that attaching an organic carboxylic acid metal salt on metal particles can effectively prevent the metal particles from undergoing reaction with a solvent such as water and thereby emitting, for example, a hydrogen gas or being corroded (for example, see JP-A No. 2011-012223).

However, the invention described in JP-A No. 2011-012223 cannot overcome the problem of not reaching the level of sufficiently satisfying storage stability of a water-based paint and accompanying humidity resistance of a coating film. Furthermore, there is neither disclosure nor suggestion of use of thin leaf-like indium particles to enable obtaining a coating film excellent in water resistance, humidity resistance, and a metallic designing property.

SUMMARY OF THE INVENTION

The present invention aims for solving the various problems in the related art and achieving an object described below. That is, the present invention has an object to provide a water-based paint excellent in storage stability, thin leaf-like indium particles that can provide a coating film excellent in water resistance, humidity resistance, and a metallic designing property and a method for producing thin leaf-like indium particles, a glitter pigment, and a water-based paint and a coating film.

Means for Solving the Problems are as Follows

<1> Thin leaf-like indium particles,
the thin leaf-like indium particles having a first peak and a second peak at a greater particle diameter than a particle diameter at which the first peak appears in a volume-based particle size distribution representing a relationship between particle diameters of indium particles and ratios by volume of the indium particles at the particle diameters,
a volume V1 of the indium particles at the first peak and a volume V2 of the indium particles at the second peak satisfying a formula $(V1/V2) \times 100 \geq 25\%$.

<2> The thin leaf-like indium particles according to <1>,
wherein a particle diameter P1 of the indium particles at the first peak and a particle diameter P2 of the indium particles at the second peak satisfy a formula $P2/P1 \leq 12$ in the volume-based particle size distribution representing a relationship between particle diameters of the indium particles and ratios by volume of the indium particles at the particle diameters.

<3> The thin leaf-like indium particles according to <1> to <2>,
wherein an average thickness of the indium particles is 60 nm or less.

<4> The thin leaf-like indium particles according to any one of <1> to <3>,
wherein a cumulative 50% volume-based particle diameter $D_{50}$ of the indium particles is 0.70 micrometers or less.

<5> The thin leaf-like indium particles according to any one of <2> to <4>,
wherein the particle diameter P2 of the indium particles at the second peak is 0.75 micrometers or less.

<6> The thin leaf-like indium particles according to any one of <1> to <5>,
wherein the thin leaf-like indium particles include an organic material layer on at least part of surfaces of the thin leaf-like indium particles.

<7> A method for producing thin leaf-like indium particles, the method including:
  a release layer forming step of providing a release layer on a base material;
  a vacuum vapor deposition step of depositing a metal layer containing thin leaf-like indium particles on the release layer by vacuum vapor deposition in a manner that an average vapor deposition thickness is 60 nm or less; and
  a releasing step of dissolving the release layer to release the metal layer.

<8> A glitter pigment, including:
  the thin leaf-like indium particles according to any one of <1> to <6>.

<9> A water-based paint, including:
  water; and
  the thin leaf-like indium particles according to any one of <1> to <6>.

<10> A coating film, including:
  thin leaf-like indium particles,
  wherein the coating film has a surface roughness Ra of 30 nm or less.

<11> The coating film according to <10>,
  wherein the coating film has a gloss value of 300 or greater at an incident angle of 20°, and
  wherein the coating film has a gloss value of 320 or greater at an incident angle of 60°.

<12> The coating film according to <10> or <11>,
  wherein the coating film has $L^*$ value of 60 or greater, $a^*$ value of −5 or greater but 0.5 or less, and $b^*$ value of −3 or greater but 10 or less in a CIE Lab color system.

The present invention can solve the various problems in the related art, achieve the object described above, and provide a water-based paint excellent in storage stability, thin leaf-like indium particles that can provide a coating film excellent in water resistance, humidity resistance, and a metallic designing property and a method for producing thin leaf-like indium particles, a glitter pigment, and a water-based paint and a coating film.

Figure 1:
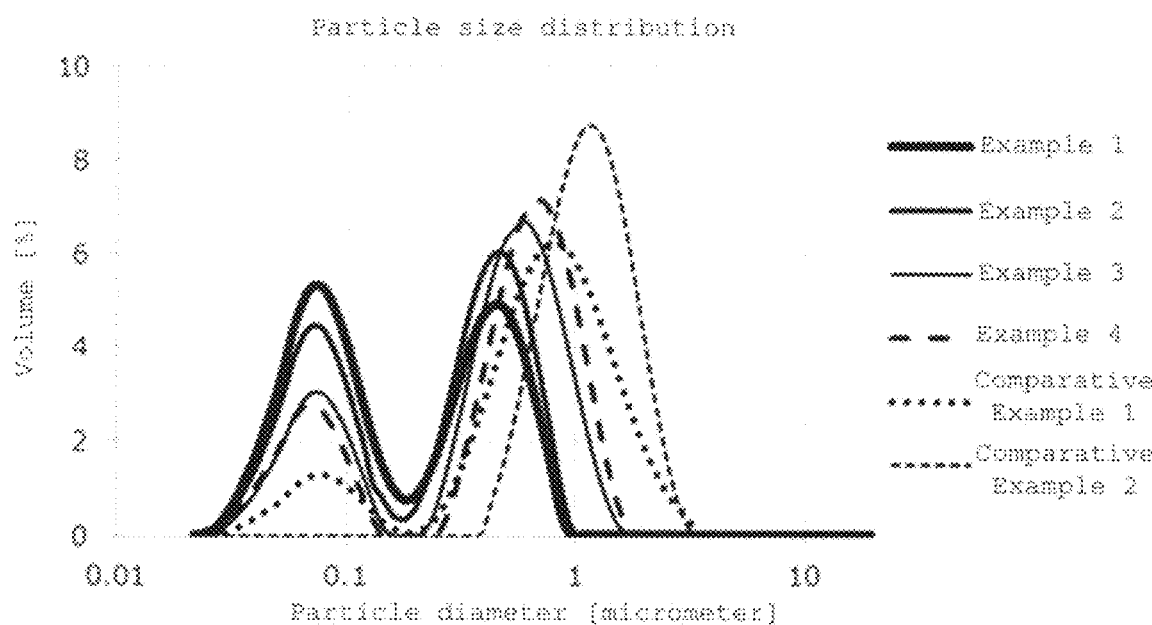
FIG. 1 is a graph plotting results of volume-based particle size distributions of thin leaf-like indium particles of Examples 1 to 4 and Comparative Example 1 and thin leaf-like aluminum particles of Comparative Example 2.

DETAILED DESCRIPTION OF THE INVENTION (Thin Leaf-Like Indium Particles)

Thin leaf-like indium particles of the present invention have a first peak and a second peak at a greater particle diameter than a particle diameter at which the first peak appears in a volume-based particle size distribution representing a relationship between particle diameters of indium particles and ratios by volume of the indium particles at the particle diameters. A volume V1 of the indium particles at the first peak and a volume V2 of the indium particles at the second peak satisfy a formula $(V1/V2) \times 100 \geq 25\%$. That is, the indium particles of the present invention are characterized by having a thin leaf-like shape, a small cumulative 50% volume-based average particle diameter, a small average thickness, a bimodal distribution with two peaks for ultrafine particles and fine particles, and a volume ratio $(V1/V2) \times 100$ of 25% or higher.

The thin leaf-like indium particles of the present invention can provide a coating film excellent in water resistance, humidity resistance, and a metallic designing property, and a water-based paint excellent in storage stability.

In terms of water resistance and humidity resistance, aluminum is a metal that has a high ionization tendency (ionization tendency: order of standard oxidation-reduction potential between hydrated ion and elementary metal in an aqueous solution), reacts with water to emit a hydrogen gas, and exhibits a high reactivity particularly with high-temperature water and water vapor. Metal particles having a smaller average particle diameter have a greater specific surface area (specific surface area: surface area per unit mass or surface area per unit volume) and add to hydrogen gas emission due to a greater contact area at the interface between the metal particles and a water solvent. As compared with this, indium is known to be stable and non-toxic with respect to water. Besides, thin leaf-like indium particles maintain a chemically stable state even when they have a small cumulative 50% volume-based particle diameter.

A metallic designing property (high gloss value) is considered attributable to the thin leaf-like shape of the indium particles, the small cumulative 50% volume-based particle diameter of the indium particles, and the bimodal distribution of the indium particles with two peaks for ultrafine particles and fine particles. These particle properties are considered as being determined by the method for producing the indium particles and the method for growing particles.

The thin leaf-like indium particles of the present invention are obtained by forming a thin metal film layer on a base material by vacuum vapor deposition generically called physical vapor deposition (PVD) or sputtering, and releasing the thin metal film layer. The film growing process of the thin metal film layer formed by vacuum vapor deposition or sputtering is influential to the properties of the indium particles of the present invention, i.e., the thin leaf-like shape, the small cumulative 50% volume-based particle diameter, and the bimodal distribution with two peaks for ultrafine particles and fine particles.

Here, the film growing process of the thin metal film layer is considered as follows. In the case of vacuum vapor deposition, upon reaching the surface of the base material, individual atoms flying from a vapor deposition source interact with the base material and lose energy, to adsorb to the base material, diffuse over the surface of the base material, and collide and bind with metal atoms mutually, to thereby form a three-dimensional nucleus. When the formed three-dimensional nucleus has acquired atoms diffused over the surface of the base material up to a number of atoms that is greater than a certain critical value, it coalesces with an adjacent three-dimensional nucleus and grows into an island-like state, to thereby form an island-like structured film.

The thin leaf-like indium particles of the present invention are considered as being obtained from this film growing process in an island-like growing fashion. Owing to this island-like growing fashion, the indium particles to be obtained are considered as having a thin leaf-like shape, a small cumulative 50% volume-based particle diameter, and a bimodal distribution with two peaks for ultrafine particles and fine particles.

Such thin leaf-like indium particles of the present invention can provide an extremely closely packed coating film having a low surface roughness Ra. In the presence of ultrafine particles and fine particles, it is considered that the ultrafine particles get into and closely pack the gaps between the fine particles, to thereby reduce a space factor expressing the packing degree (space factor: ratio of space present between particles in a layer packed with the particles).

Further, the surface roughness Ra of the coating film can be reduced to an extremely low level owing to the small cumulative 50% volume-based particle diameter and the close packing described above. Owing to this, it is considered that the gloss value, which is an index of a metallic designing property, can be increased and an excellent metallic designing property can be expressed.

The indium particles of the present invention are thin leaf-like particles. The thin leaf-like particles may also be referred to as, for example, scaly particles, flat plate-like particles, or flaky particles.

In the present invention, thin leaf-like particles refer to particles having an approximately flat surface and an approximately uniform thickness in a direction perpendicular to the approximately flat surface. The thin leaf-like particles refer to particles having a shape with the thickness that is extremely small and with the approximately flat surface that is extremely long. The length of the approximately flat surface refers to the diameter of a circle having the same projected area as the projected area of the thin leaf-like particles.

The shape of the approximately flat surface is not particularly limited and may be approximately selected depending on the intended purpose. Examples of the shape of the approximately flat surface include an approximately circular shape, an approximately elliptical shape, polygonal shapes such as an approximately triangular shape, an approximately quadrangular shape, an approximately pentagonal shape, an approximately hexagonal shape, an approximately heptagonal shape, and an approximately octagonal shape, and a random irregular shape. Among these shapes, an approximately circular shape is preferable.

Primary particles of the thin leaf-like indium particles may include a single layer, or two or more laminated layers. Primary particles of thin leaf-like indium may aggregate and form secondary particles.

The thin leaf-like indium particles are formed of indium having a purity of 95% or higher and may contain a trace impurity, but do not contain an alloy with another metal.

The indium particles have a first peak and a second peak at a greater particle diameter than a particle diameter at which the first peak appears in a volume-based particle size distribution representing a relationship between particle diameters of the indium particles and ratios by volume of the indium particles at the particle diameters, and a volume V1 of the indium particles at the first peak and a volume V2 of the indium particles at the second peak satisfy a formula $(V1/V2) \times 100 \geq 25\%$, preferably satisfy a formula $(V1/V2) \times 100 \geq 35\%$, and more preferably satisfy a formula $(V1/V2) \times 100 \geq 50\%$.

When the formula $(V1/V2) \times 100 \geq 25\%$ is satisfied, there is an advantage that the surface roughness Ra of a coating film is reduced, the gloss value, which is an index of a metallic designing property, can be increased, and an excellent metallic designing property can be expressed.

In the volume-based particle size distribution representing a relationship between particle diameters of the indium particles and ratios by volume of the indium particles at the particle diameters, a particle diameter P1 of the indium particles at the first peak and a particle diameter P2 of the indium particles at the second peak satisfy preferably a formula $P2/P1 \leq 12$, more preferably $P2/P1 \leq 10$, yet more preferably $P2/P1 \geq 8$, and particularly preferably $P2/P1 \leq 7$.

When the formula $P2/P1 \leq 12$ is satisfied, there is an advantage that the surface roughness Ra of a coating film is reduced, the gloss value, which is an index of a metallic designing property, can be increased, and an excellent metallic designing property can be expressed.

The particle diameter P1 of the indium particles at the first peak is preferably 0.075 micrometers or less.

The particle diameter P2 of the indium particles at the second peak is preferably 0.75 micrometers or less, more preferably 0.6 micrometers or less, and yet more preferably 0.5 micrometers or less.

(V1/V2)×100 and P2/P1 can be obtained by measuring a volume-based particle size distribution representing a relationship between particle diameters of the indium particles and ratios by volume of the indium particles at the particle diameters. The volume-based particle size distribution can be measured with, for example, a laser diffraction/scattering particle size analyzer.

In the volume-based particle size distribution representing a relationship between particle diameters of the indium particles and ratios by volume of the indium particles at the particle diameters, an area S1 of the indium particles at the first peak and an area S2 of the indium particles at the second peak preferably satisfy a formula (S1/S2)×100≥20%, more preferably satisfy a formula (S1/S2)×100≥30%, yet more preferably satisfy a formula (S1/S2)×100≥50%, and particularly preferably satisfy a formula (S1/S2)×100≥70%.

When the formula (S1/S2)×100≥20% is satisfied, there is an advantage that the surface roughness Ra of a coating film is reduced, the gloss value, which is an index of a metallic designing property, can be increased, and an excellent metallic designing property can be expressed.

The cumulative 50% volume-based particle diameter $D_{50}$ of the indium particles is preferably 0.70 micrometers or less, more preferably 0.60 micrometers or less, yet more preferably 0.50 micrometers or less, and particularly preferably 0.40 micrometers or less.

When the cumulative 50% volume-based particle diameter $D_{50}$ is 0.70 micrometers or less, there is an advantage that the surface roughness Ra of a coating film is reduced, the gloss value, which is an index of a metallic designing property, can be increased, and an excellent metallic designing property can be expressed.

The cumulative 50% volume-based particle diameter ($D_{50}$) is a particle diameter when volume-based distribution is cumulated to 50% in a particle diameter distribution curve obtained by a laser diffraction method, and is a length obtained by taking the average of the longer diameter and the shorter diameter of an indium particle measured when the indium particle, which is non-spherical, is assumed to be a perfect sphere. However, actual indium particles are not spherical but have a thin leaf-like shape having a longer side and a shorter side. Hence, $D_{50}$ is a value different from the actual length of the indium particles in the longer side direction (longer diameter) and the actual length of the indium particles in the shorter side direction (shorter diameter).

Examples of units that utilize the laser diffraction method include a laser diffraction/scattering particle size analyzer.

The average thickness of the indium particles is preferably 60 nm or less, more preferably 50 nm or less, and yet more preferably 45 nm or less. When the average thickness of the indium particles is 60 nm or less, there is an advantage that the surface roughness Ra of a coating film is reduced, the gloss value, which is an index of a metallic designing property, can be increased, and an excellent metallic designing property can be expressed.

In the present invention, the average thickness of the indium particles is defined as the shortest length among the three dimensions of the thin leaf-like indium particles.

The average thickness can be obtained by, for example, scanning electron microscope (SEM) observation, X-ray fluorescence spectrometry (XRF), and ultraviolet-visible spectroscopy. The average thickness of the indium particles is the same as the average vapor deposition thickness of a vapor-deposited thin indium film.

When scanning electron microscope (SEM) observation is used, the average vapor deposition thickness of a vapor-deposited thin indium film is a value obtained by averaging thickness measurements obtained at from five through ten positions of the vapor-deposited thin indium film through observation of its cross section with a scanning electron microscope (SEM).

When X-ray fluorescence spectrometry (XRF) is used, the average thickness can be measured by a quantitative analysis.

When ultraviolet-visible spectroscopy is used, the film thickness can be calculated based on a spectrum obtained by measuring reflectivity with an ultraviolet-visible spectrophotometer.

A ratio ($D_{50}$ (nm)/average thickness (nm)) between the cumulative 50% volume-based particle diameter ($D_{50}$) (nm) and the average thickness (nm) is preferably 50 or greater and more preferably 100 or greater.

In the present invention, the ratio "$D_{50}$ (nm)/average thickness (nm)" is a ratio calculated by dividing $D_{50}$ measured by a laser diffraction method by the average thickness obtained by scanning electron microscope (SEM) observation or X-ray fluorescence spectrometry. Hence, the ratio "$D_{50}$ (nm)/average thickness (nm)" is a ratio different from a parameter generally called an aspect ratio.

It is preferable that the thin leaf-like indium particles of the present invention have an organic material layer on at least part of surfaces of the thin leaf-like indium particles, preferably on surfaces, which are on a release layer side. The organic material layer is a layer of an organic material that is used as a release layer in a method for producing thin leaf-like indium particles. The organic material layer has a function of suppressing aggregation of thin leaf-like indium particles, and sufficiently performs the function even if the organic material layer is formed on part, not the whole, of the surfaces of the thin leaf-like indium particles.

Presence of the organic material layer on at least part of the surfaces of the thin leaf-like indium particles can be analyzed with a scanning transmission electron microscope (Scanning Transmission Electron Microscope-Energy Dispersive X-ray Analysis: STEM-EDX).

Examples of the constituent material of the organic material layer include the same materials as organic materials for constituting a release layer described below.

(Method for Producing Thin Leaf-Like Indium Particles)

A method for producing thin leaf-like indium particles of the present invention includes a release layer forming step, a vacuum vapor deposition step, and a releasing step, and further includes other steps as needed.

<Release Layer Forming Step>

The release layer forming step is a step of providing a release layer on a base material.

—Base Material—

A base material is not particularly limited so long as the base material has a smooth surface. Various kinds of base materials can be used. Among various kinds of base materials, resin films having flexibility, heat resistance, solvent resistance, and dimensional stability, metals, and composite films of metals and resin films can be used appropriately.

Examples of the resin films include polyester films, polyethylene films, polypropylene films, polystyrene films, and polyimide films. Examples of the metals include copper foils, aluminum foils, nickel foils, iron foils, and alloy foils. Examples of the composite films of metals and resin films include films obtained by laminating the resin films and the metals.

—Release Layer—

As a release layer, various organic materials that can dissolve in a releasing step described below can be used. Appropriate selection of an organic material for constituting the release layer is preferable, because the organic material that has adhered and remained on the surface of an island-like structured film can function as a protective layer for the thin leaf-like indium particles.

The protective layer has a function of suppressing the thin leaf-like indium particle from, for example, aggregation, oxidation, and elution into a solvent. Particularly, it is preferable to use the organic material used in the release layer as the protective layer, because this makes it unnecessary to separately provide a surface treatment step.

Examples of the organic material for constituting the release layer that can be used as the protective layer include cellulose acetate butyrate (CAB), other cellulose derivatives, polyvinyl alcohols, polyvinyl butyral, polyethylene glycol, polyacrylic acid, polyacrylamide, acrylic acid copolymers, and modified nylon resins. One of these organic materials may be used alone or two or more of these organic materials may be used in combination. Among these organic materials, cellulose acetate butyrate (CAB) is preferable because it has a high performance as a protective layer.

The method for forming the release layer is not particularly limited and may be appropriately selected depending on the intended purpose. Examples of the method include an inkjet method, a blade coating method, a gravure coating method, a gravure offset coating method, a bar coating method, a roll coating method, a knife coating method, an air knife coating method, a comma coating method, a U-comma coating method, an AKKU coating method, a smoothing coating method, a micro-gravure coating method, a reverse roll coating method, a 4-roll coating method, a 5-roll coating method, a dip coating method, a curtain coating method, a slide coating method, and a die coating method. One of these methods may be used alone or two or more of these methods may be used in combination.

<Vacuum Vapor Deposition Step>

The vacuum vapor deposition step is a step of depositing a metal layer containing thin leaf-like indium particles on the release layer by vacuum vapor deposition in a manner that an average vapor deposition thickness is 60 nm or less.

The average vapor deposition thickness of the metal layer containing thin leaf-like indium particles is 60 nm or less, preferably 55 nm or less, more preferably 50 nm or less, and yet more preferably 45 nm or less. The average vapor deposition thickness of the metal layer containing thin leaf-like indium particles is the same as the average thickness of the indium particles.

When the average vapor deposition thickness of the metal layer is 60 nm or less, there is an advantage that the surface roughness Ra of a coating film is reduced, the gloss value, which is an index of a metallic designing property, can be increased, and an excellent metallic designing property can be expressed.

The average vapor deposition thickness is a value obtained by averaging thickness measurements obtained at from five through ten positions of the metal layer through observation of a cross-section of the metal layer with a scanning electron microscope (SEM).

It is preferable that the metal layer be an island-like structured film. The island-like structured film can be formed by various methods such as vacuum vapor deposition, sputtering, and plating. Among these methods, vacuum vapor deposition is preferable.

Vacuum vapor deposition is preferred to plating because, for example, vacuum vapor deposition can deposit a film on a base material formed of a resin and produces no exhaust liquid. Vacuum vapor deposition is preferred to sputtering because, for example, vacuum vapor deposition can set a high degree of vacuum and has a high film deposition rate (vapor deposition rate).

The vacuum deposition rate of vacuum vapor deposition is preferably 10 nm/sec or higher, and more preferably 10 nm/sec or higher but 80 nm/sec or lower.

In deposition of a thin film of indium particles on the release layer, upon reaching the surface of the base material, individual indium atoms flying from a vapor deposition source interact with the base material and lose energy, to adsorb to the base material, diffuse over the surface of the base material, and collide and bind with indium atoms mutually, to thereby form a three-dimensional nucleus. When the formed three-dimensional nucleus has acquired atoms diffused over the surface of the base material up to a number of atoms that is greater than a certain critical value, it coalesces with an adjacent three-dimensional nucleus and grows into an island-like state, to thereby form an island-like structured film. Such an island-like structured film maintains the form of a film so long as it is present on the base material but breaks into individual islands when released from the base material. The individual islands are indium particles.

The shape and the cumulative 50% volume-based particle diameter of the indium particles to be obtained finally, and the volume ratio $(V1/V2) \times 100$ between ultrafine particles and fine particles can be controlled by varying the average film thickness (hereinafter, may be referred to simply as "film thickness") of the island-like structured film. The average film thickness of the island-like structured film can be measured by utilizing film interference during film deposition. Therefore, by previously obtaining a relationship between the average film thickness of the island-like structured film and the shape and size of the indium particles, it is possible to obtain indium particles having a desired shape and a desired size easily. Examples of the operation factors that are influential to the shape and the cumulative 50% volume-based particle diameter of the indium particles and the volume ratio between ultrafine particles and fine particles include the film deposition method, the energy (for example, kinetic energy and temperature) of indium flying onto the base material, surface free energy on the release layer, materials/temperature, the method and temperature for cooling the base material, and film deposition rate.

<Releasing Step>

The releasing step is a step of dissolving the release layer to release the metal layer.

The solvent that can dissolve the release layer is not particularly limited and may be appropriately selected depending on the intended purpose so long as the solvent can dissolve the release layer. A solvent that can be used subsequently as a solvent of a glitter pigment dispersion liquid is preferable. In the case of a water-based paint and a water-based ink, a solvent having compatibility with water is preferable.

Examples of the solvent that can dissolve the release layer include: alcohols such as methanol, ethanol, propanol, isopropanol, butanol, octanol, dodecanol, ethylene glycol, and propylene glycol; ethers such as tetrahydron; ketones such as acetone, methyl ethyl ketone, and acetyl acetone; esters such as methyl acetate, ethyl acetate, butyl acetate, and phenyl acetate; glycol ethers such as ethyl cellosolve, butyl cellosolve, ethyl carbitol, butyl carbitol, ethylene glycol monomethyl ether, ethylene glycol monoethyl ether, ethylene glycol monoisopropyl ether, ethylene glycol monobutyl ether, ethylene glycol monohexyl ether, ethylene glycol monophenyl ether, diethylene glycol monomethyl ether, diethylene glycol monoethyl ether, diethylene glycol monobutyl ether, diethylene glycol dimethyl ether, diethylene glycol diethyl ether, triethylene glycol monomethyl ether, triethylene glycol monoethyl ether, triethylene glycol monobutyl ether, propylene glycol monomethyl ether, propylene glycol monoethyl ether, dipropylene glycol monomethyl ether, dipropylene glycol monoethyl ether, and diethylene glycol monomethyl ether acetate; phenols such as phenol and cresol; aliphatic or aromatic hydrocarbons such as pentane, hexane, heptane, octane, dodecane, tridecane, tetradecane, pentadecane, hexadecane, octadecane, octadecene, benzene, toluene, xylene, trimesin, nitrobenzene, aniline, and methoxybenzene; aliphatic or aromatic hydrocarbon chlorides such as dichloromethane, chloroform, trichloroethane, chlorobenzene, and dichlorobenzene; sulfur-containing compounds such as dimethyl sulfoxide; and nitrogen-containing compounds such as dimethyl formamide, dimethyl acetamide, acetonitrile, propionitrile, and benzonitrile. One of these solvents may be used alone or two or more of these solvents may be used in combination.

By the release layer being dissolved, the island-like structured film is released from the base material, and the island-like structure breaks into individual islands, which are indium particles. Hence, a thin leaf-like indium particle dispersion liquid is obtained without a pulverizing step. However, as needed, pulverization and classification may be performed. When primary particles of the thin leaf-like indium particles have aggregated, the aggregated particles may be cracked as needed.

Furthermore, recovery of the thin leaf-like indium particles and various operations for adjusting physical properties of the thin leaf-like indium particles may be performed as needed. For example, the particle size of the thin leaf-like indium particles may be adjusted by classification, or the thin leaf-like indium particles may be recovered or the solid concentration of the dispersion liquid may be adjusted by such methods as centrifugation and suction filtration. Solvent displacement may be performed, or, for example, viscosity modification may be performed using an additive. A dispersant may be added. However, it is not indispensable to newly add a dispersant, because in the present invention, a glitter pigment dispersion liquid formed of thin leaf-like indium particles having a good dispersibility can be obtained so long as an appropriate organic material is selected as the release layer.

<Other Steps>

Examples of the other steps include a step of extracting the released metal layers in the form of a dispersion liquid, and a step of recovering the island-like metal layers from the dispersion liquid as thin leaf-like indium particles.

(Glitter Pigment)

A glitter pigment of the present invention contains the thin leaf-like indium particles of the present invention.

Here, a glitter pigment refers to a pigment that can radiate a metallic gloss.

The glitter pigment of the present invention may contain any other glitter pigment as needed. Examples of any other glitter pigment include a metal pigment (for example, an aluminum pigment), a pigment obtained from natural mica (for example, a pearl pigment), and a glass flake pigment.

(Water-Based Paint)

A water-based paint of the present invention contains water and the thin leaf-like indium particles of the present invention, preferably contains an organic solvent, and further contains other components as needed.

The content of the thin leaf-like indium particles is preferably 0.1% by mass or greater but 5.0% by mass or less relative to the total amount of the water-based paint.

—Water—

As the water, for example, pure water such as ion-exchanged water, ultrafiltration water, reverse osmotic water, and distilled water or ultrapure water may be used.

—Organic Solvent—

The organic solvent is not particularly limited and may be appropriately selected depending on the intended purpose. Examples of the organic solvent include polyvalent alcohols, polyvalent alcohol alkyl ethers, polyvalent alcohol aryl ethers, nitrogen-containing heterocyclic compounds, amides, amines, and sulfur-containing compounds. One of these organic solvents may be used alone or two or more of these organic solvents may be used in combination.

Examples of the polyvalent alcohols include ethylene glycol, diethylene glycol, 1,2-propanediol, 1,3-propanediol, 1,2-butanediol, 1,3-butanediol, 1,4-butanediol, 2,3-butanediol, 3-methyl-1,3-butanediol, triethylene glycol, polyethylene glycol, polypropylene glycol, 1,2-pentanediol, 1,3-pentanediol, 1,4-pentanediol, 2,4-pentanediol, 1,5-pentanediol, 1,2-hexanediol, 1,6-hexanediol, 1,3-hexanediol, 2,5-hexanediol, 1,5-hexanediol, glycerin, 1,2,6-hexanetriol, 2-ethyl-1,3-hexanediol, ethyl-1,2,4-butanetriol, 1,2,3-butanetriol, and 2,2,4-trimethyl-1,3-pentanediol.

Examples of the polyvalent alcohol alkyl ethers include ethylene glycol monoethyl ether, ethylene glycol monobutyl ether, diethylene glycol monomethyl ether, diethylene glycol monoethyl ether, diethylene glycol monobutyl ether, tetraethylene glycol monomethyl ether, and propylene glycol monoethyl ether.

Examples of the polyvalent alcohol aryl ethers include ethylene glycol monophenyl ether and ethylene glycol monobenzyl ether.

Examples of the nitrogen-containing heterocyclic compounds include 2-pyrrolidone, N-methyl-2-pyrrolidone, N-hydroxyethyl-2-pyrrolidone, 1,3-dimethyl-2-imidazolidinone, ε-caprolactam, and γ-butyrolactone.

Examples of the amides include formamide, N-methyl formamide, N,N-dimethyl formamide, 3-methoxy-N,N-dimethyl propionamide, and 3-butoxy-N,N-dimethyl propionamide.

Examples of the amines include monoethanol amine, diethanol amine, and triethyl amine.

Examples of the sulfur-containing compounds include dimethyl sulfoxide, sulfolane, and thiodiethanol.

—Other Components—

The other components are not particularly limited and may be appropriately selected depending on the intended purpose. Examples of the other components include a polymer component, a cross-linking agent, an age resistor, an ultraviolet absorber, a filler, a polymerization inhibitor, a surface conditioner, an antistatic agent, a defoaming agent, a viscosity modifier, a light-resistant stabilizer, a weathering stabilizer, a heat stabilizer, an antioxidant, a leveling agent, an antiseptic/fungicide, an anti-rust agent, and a pH adjustor.

(Coating Film)

A coating film of the present invention contains thin leaf-like indium particles and further contains other components as needed.

The surface roughness Ra of the coating film is 30 nm or less, preferably 25 nm or less, and more preferably 15 nm or less.

When the surface roughness Ra is 30 nm or less, there is an advantage that the gloss value, which is an index of a metallic designing property, can be increased, and an excellent metallic designing property can be expressed.

The surface roughness Ra can be obtained with, for example, a scanning probe microscope (AFM) as an arithmetic mean surface roughness Ra in a range of 30 micrometers×30 micrometers.

The gloss value of the coating film at an incident angle of 20° is preferably 300 or greater, more preferably 500 or greater, yet more preferably 700 or greater, and particularly preferably 900 or greater.

A gloss value of the coating film of 300 or greater at an incident angle of 20° indicates a high specularity and an excellent metallic designing property.

The gloss value of the coating film at an incident angle of 60° is preferably 320 or greater, more preferably 350 or greater, and yet more preferably 400 or greater.

A gloss value of the coating film of 320 or greater at an incident angle of 60° indicates a high specularity and an excellent metallic designing property.

The gloss value of the coating film can be measured with, for example, a gloss meter according to a collimated light method compliant with JIS Z8741 "specular gloss measuring method" at incident angles of 20° and 60°.

It is preferable that the coating film have L* value of 60 or greater, a* value of −5 or greater but 0.5 or less, and b* value of −3 or greater but 10 or less in a CIE Lab color system.

The L* value of the coating film is preferably 60 or greater, more preferably 65 or greater but 80 or less, and yet more preferably 65 or greater but 75 or less.

The a* value of the coating film is preferably −5 or greater but 0.5 or less and more preferably −4 or greater but 0.3 or less.

The b* value of the coating film is preferably −3 or greater but 10 or less and more preferably −1 or greater but 8 or less.

When the hue (L* value, a* value, and b value) of the CIE Lab color system is in the ranges described above, an excellent metallic designing property that gives an air of luxury can be expressed (a design that is no less inferior to a design imparted by chromium plating that is a representative technique for imparting a metallic design can be imparted).

Using an ultraviolet-visible-near infrared spectrophotometer, the hue (L* value, a* value, and b value) of the CIE Lab color system can be calculated based on a reflection spectrum at an incident angle of 5° in a wavelength range of from 300 nm through 800 nm.

The coating film of the present invention can be formed by using the paint of the present invention.

The method for forming the coating film is not particularly limited and may be appropriately selected depending on the intended purpose. Examples of the method include a spin coating method, an inkjet method, a blade coating method, a gravure coating method, a gravure offset coating method, a bar coating method, a roll coating method, a knife coating method, an air knife coating method, a comma coating method, a U-comma coating method, an AKKU coating method, a smoothing coating method, a micro-gravure coating method, a reverse roll coating method, a 4-roll coating method, a 5-roll coating method, a dip coating method, a curtain coating method, a slide coating method, and a die coating method. One of these methods may be used alone or two or more of these methods may be used in combination.

The coating film of the present invention can be formed by, for example, supplying the water-based paint of the present invention onto a substrate (for example, a glass plate) and applying the water-based paint by a spin coating method.

Specifically, first, the water-based paint is supplied to about the rotation center in a low-speed rotation state. Then, with the rotation speed increased, a thin film is formed on the surface of the substrate with the glitter pigment dispersion liquid shaken off by a centrifugal force, and any residual solvent is dried, to obtain a coating film.

The rotation speed may be appropriately adjusted in a range of 300 rpm or greater but 1,000 rpm or less.

The solid content of the glitter pigment dispersion liquid to be used or the diluent for the glitter pigment dispersion liquid to be used are adjusted as needed for use. In order to obtain stable evaluation results in optical properties, the coating film formed is adjusted to have a hiding power, with a total light transmittance of 1% or lower.

<Applications>

The thin leaf-like indium particles of the present invention can provide a water-based paint excellent in storage stability and a coating film excellent in water resistance, humidity resistance, and a metallic designing property. Therefore, the thin leaf-like indium particles can be widely used in various fields. For example, the thin leaf-like indium particles can be used in glitter inks for inkjet or other types of printing, glitter paints for, for example, interior and exterior parts of automobiles, home appliances, and building materials, electrically conductive pigments for electrically conductive pastes, glitter pigments for imparting a metallic design to decorative films, glitter pigments used in metallic filaments for 3D printers, and glitter pigments to be kneaded into metallic designed sheets or films in melt extrusion and casting.

EXAMPLES

The present invention will be described below by way of Examples. However, the present invention should not be construed as being limited to these Examples.

Example 1

A solution containing cellulose acetate butyrate (CAB) (5% by mass) was coated on a polyethylene terephthalate (PET) film having an average thickness of 12 micrometers by a gravure coating method, and dried at from 110 degrees C. through 120 degrees C., to form a release layer. The coating amount of cellulose acetate butyrate (CAB) was 0.06 g/m$^2$±0.01 g/m$^2$.

Figure 2:
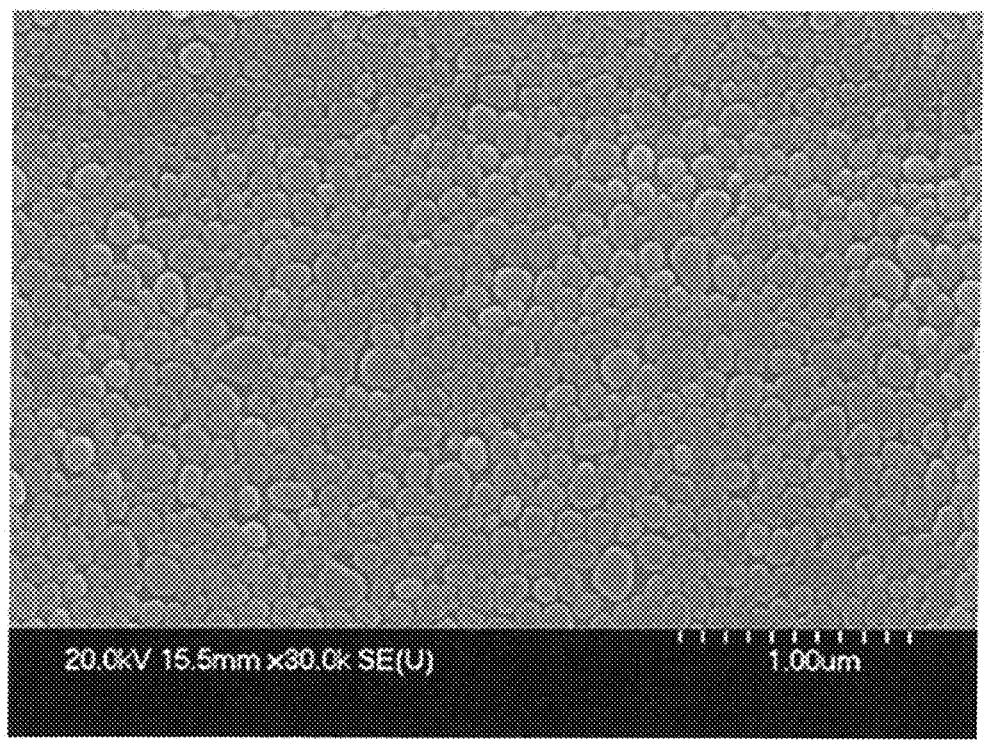
FIG. 2 is a SEM image of a vapor deposited thin indium film after vacuum vapor deposition in Example 1 (at a magnification of ×30,000)

Next, a vapor-deposited thin indium film having an average vapor deposition thickness of 37 nm was formed on the release layer at a vapor deposition rate of 30 nm/sec by a high frequency induction heating-vacuum vapor deposition method. The average vapor deposition thickness of the vapor-deposited thin indium film was a value obtained by averaging thickness measurements obtained at five positions of the vapor-deposited thin indium film through observation of its cross section with a scanning electron microscope (SEM). The result is presented in Table 1. This average vapor deposition thickness was the same as the average thickness of the indium particles (the same applies hereinafter). A SEM image of the vapor-deposited thin indium film (at a magnification of ×30,000) is illustrated in FIG. 2.

Next, propylene glycol monomethyl ether (PM) was sprayed on the PET film surface on which the release layer and the vapor-deposited thin indium film were formed, to dissolve the release layer, and the vapor-deposited thin indium film was scraped off with a doctor blade. The obtained indium particles had a thin leaf-like shape.

Next, using an ultrasonic homogenizer, the obtained mixture of the indium particles and propylene glycol monomethyl ether (PM) was pulverized down to primary particles.

Figure 7:
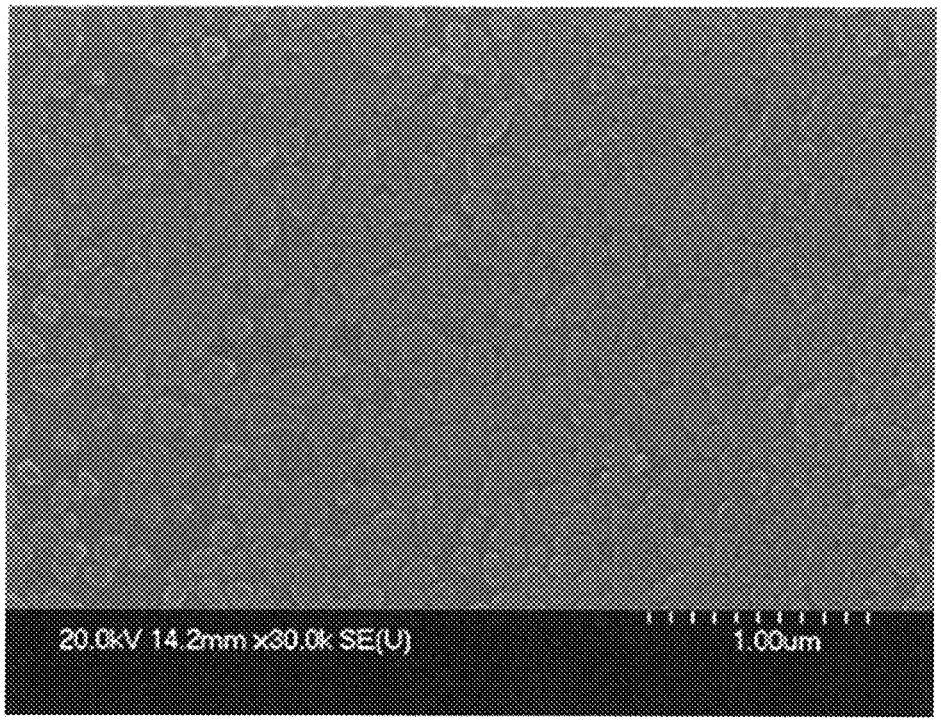
FIG. 7 is a SEM image of thin leaf-like indium particles obtained in Example 1 (at a magnification of ×30,000)

Indium particles were recovered from the obtained indium particles using a centrifuge, and the recovered indium particles were newly dispersed in PM at a solid concentration of 10% by mass, to obtain a thin leaf-like indium particle dispersion liquid of Example 1. A SEM image of the obtained thin leaf-like indium particles (at a magnification of ×30,000) is illustrated in FIG. 7.

Example 2

Figure 3:
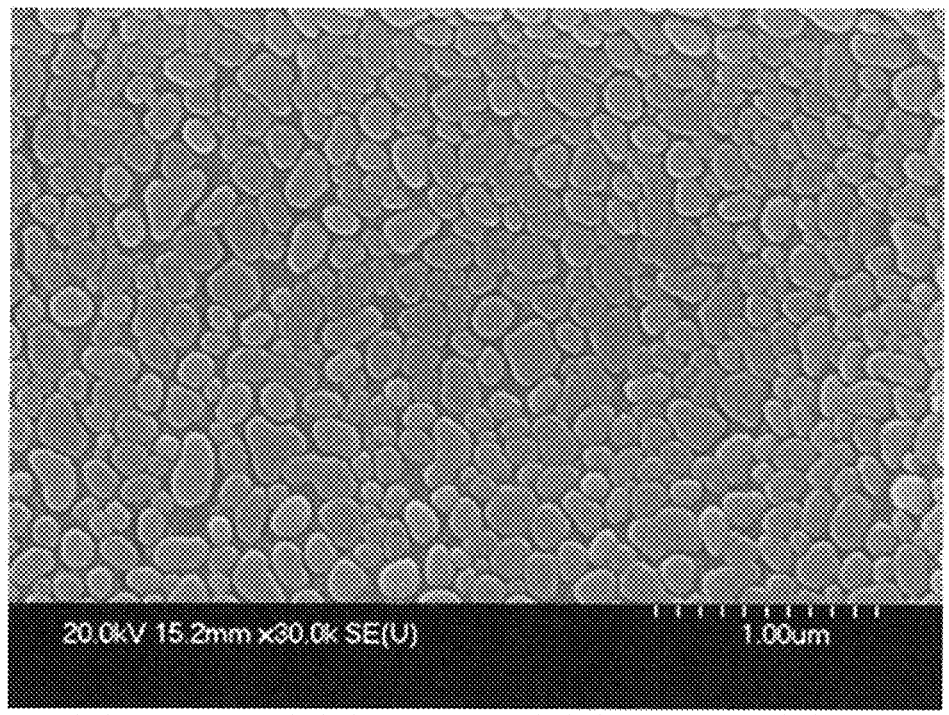
FIG. 3 is a SEM image of a vapor deposited thin indium film after vacuum vapor deposition in Example 2 (at a magnification of ×30,000)
Figure 8:
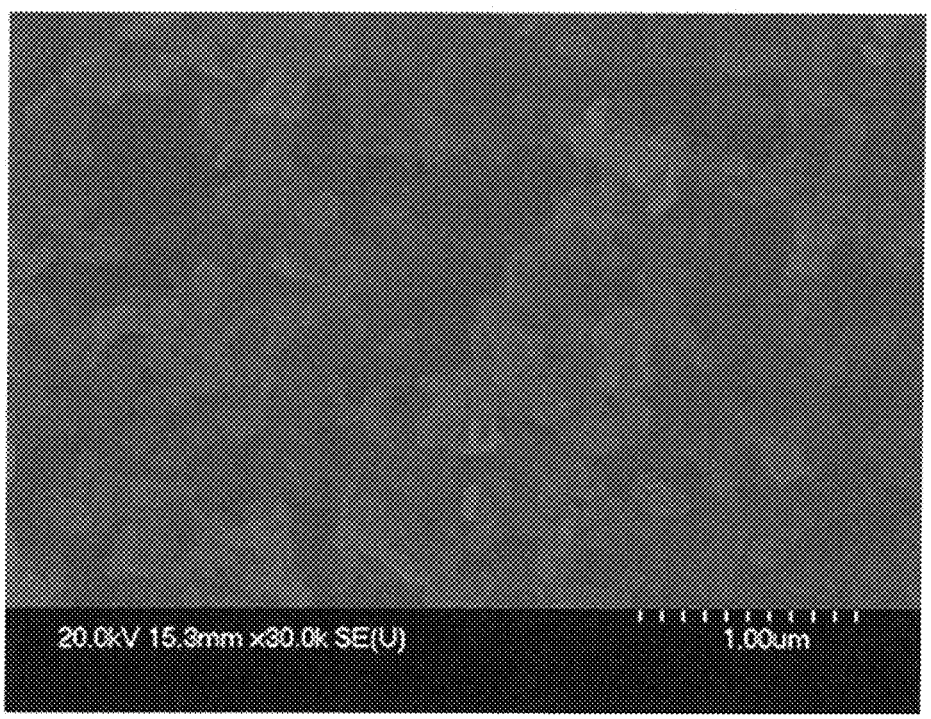
FIG. 8 is a SEM image of thin leaf-like indium particles obtained in Example 2 (at a magnification of ×30,000)

A thin leaf-like indium particle dispersion liquid of Example 2 was obtained in the same manner as in Example 1, except that unlike in Example 1, a vapor-deposited thin indium film having an average vapor deposition thickness of 43 nm was formed at a vapor deposition rate of 35 nm/sec. A SEM image of the vapor-deposited thin indium film (at a magnification of ×30,000) is illustrated in FIG. 3. A SEM image of the obtained thin leaf-like indium particles (at a magnification of ×30,000) is illustrated in FIG. 8.

Example 3

Figure 4:
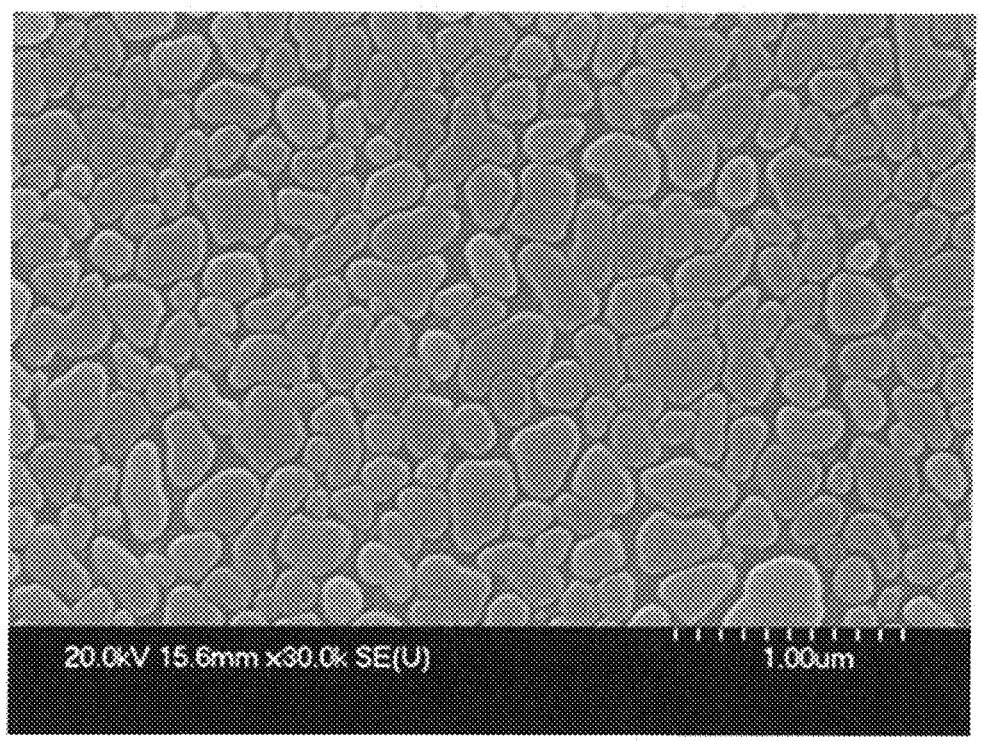
FIG. 4 is a SEM image of a vapor deposited thin indium film after vacuum vapor deposition in Example 3 (at a magnification of ×30,000)
Figure 9:
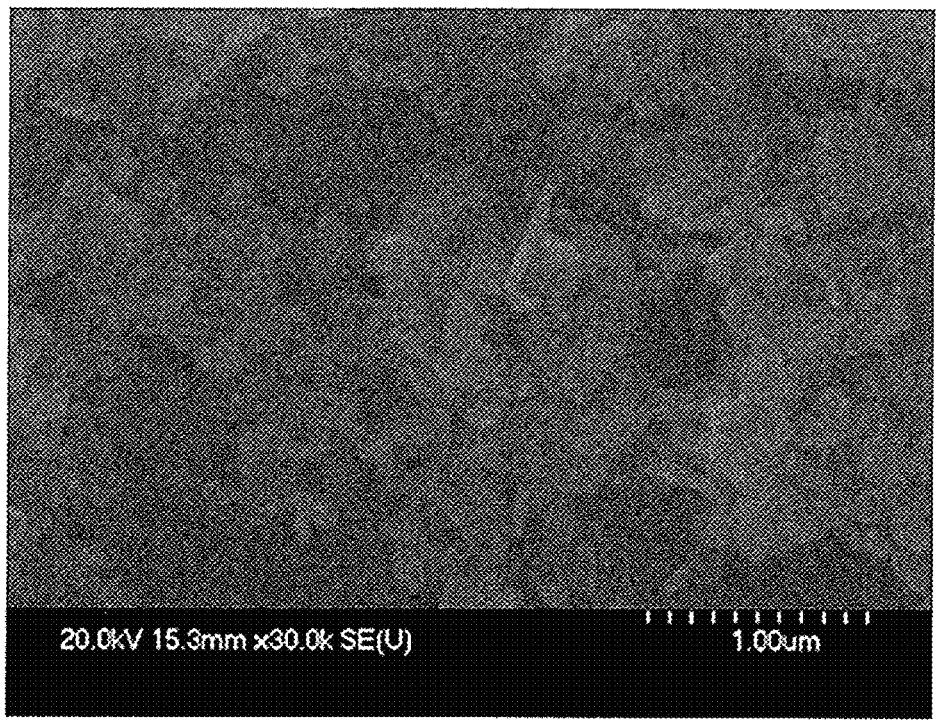
FIG. 9 is a SEM image of thin leaf-like indium particles obtained in Example 3 (at a magnification of ×30,000)

A thin leaf-like indium particle dispersion liquid of Example 3 was obtained in the same manner as in Example 1, except that unlike in Example 1, a 2 s vapor-deposited thin indium film having an average vapor deposition thickness of 51 nm was formed at a vapor deposition rate of 35 nm/sec. A SEM image of the vapor-deposited thin indium film (at a magnification of ×30,000) is illustrated in FIG. 4. A SEM image of the obtained thin leaf-like indium particles (at a magnification of ×30,000) is illustrated in FIG. 9.

Example 4

Figure 5:
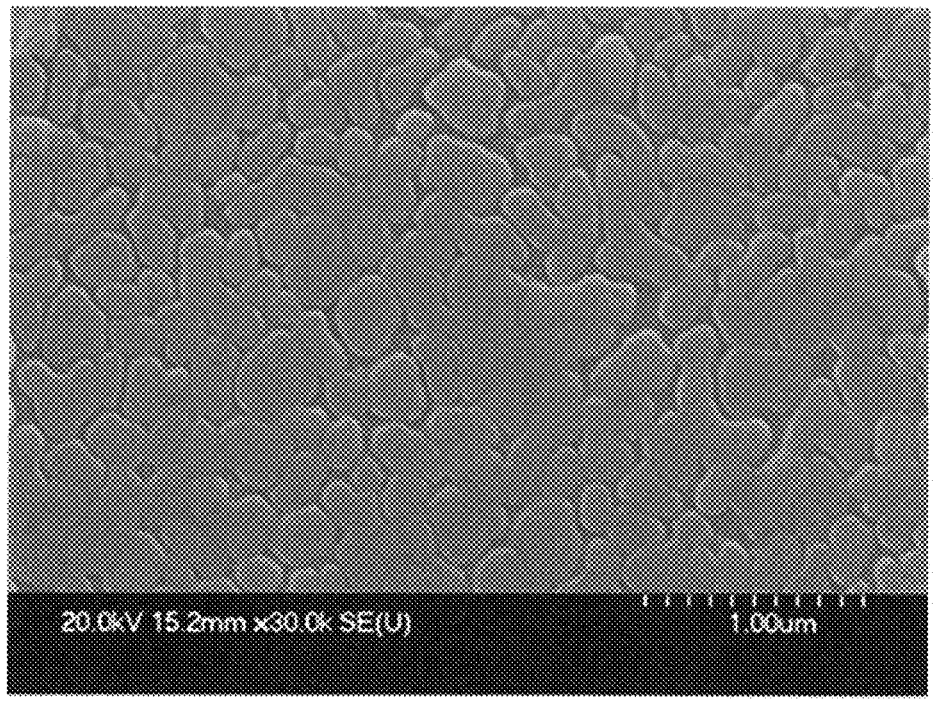
FIG. 5 is a SEM image of a vapor deposited thin indium film after vacuum vapor deposition in Example 4 (at a magnification of ×30,000)
Figure 10:
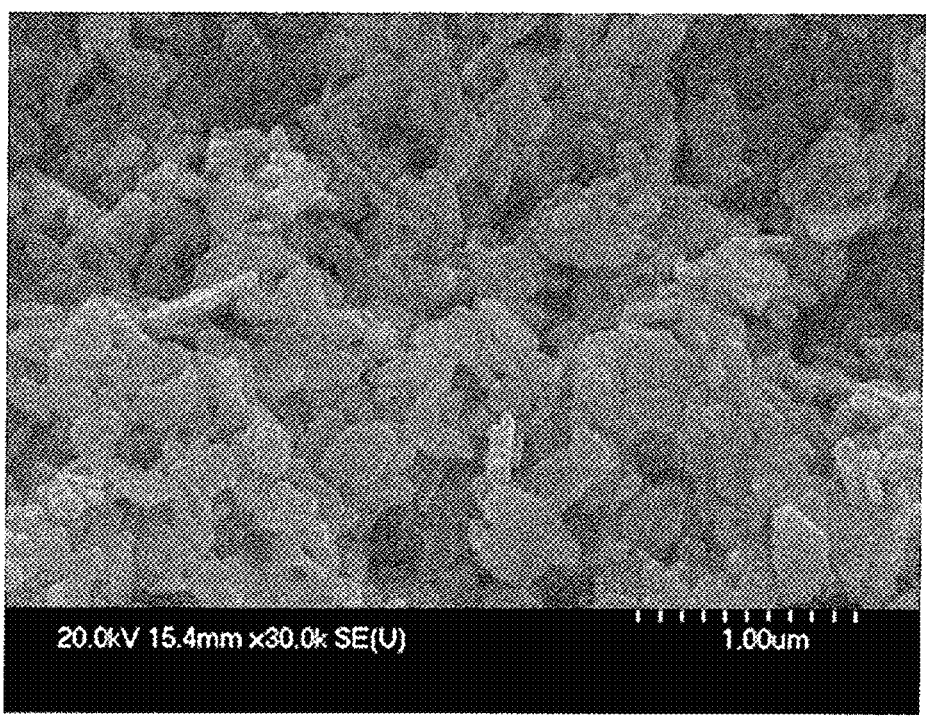
FIG. 10 is a SEM image of thin leaf-like indium particles obtained in Example 4 (at a magnification of ×30,000)

A thin leaf-like indium particle dispersion liquid of Example 4 was obtained in the same manner as in Example 1, except that unlike in Example 1, a vapor-deposited thin indium film having an average vapor deposition thickness of 55 nm was formed at a vapor deposition rate of 35 nm/sec. A SEM image of the vapor-deposited thin indium film (at a magnification of ×30,000) is illustrated in FIG. 5. A SEM image of the obtained thin leaf-like indium particles (at a magnification of ×30,000) is illustrated in FIG. 10.

Comparative Example 1

Figure 6:
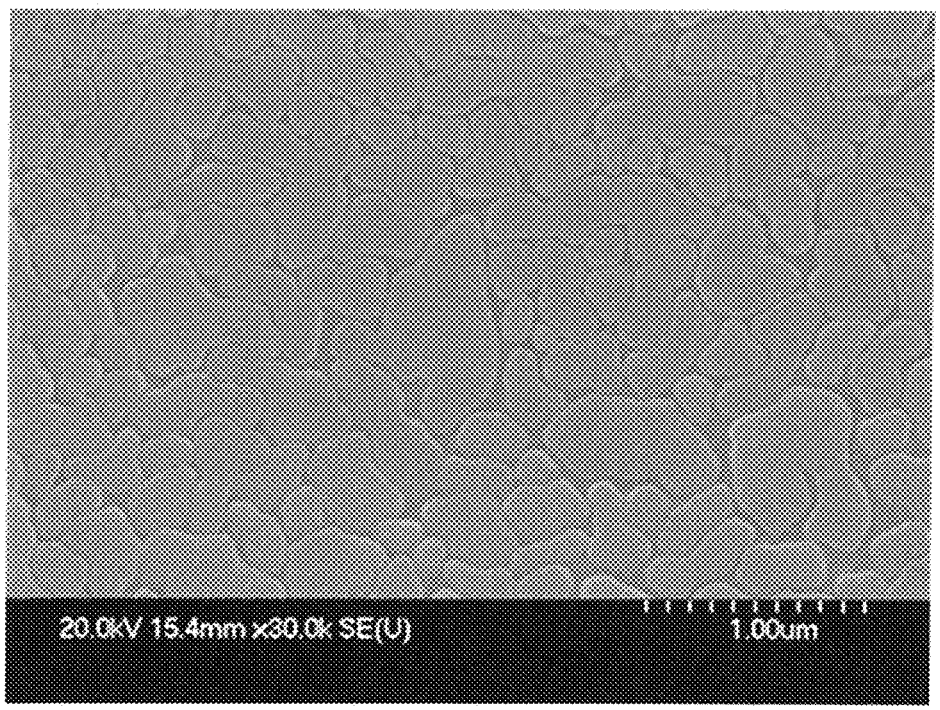
FIG. 6 is a SEM image of a vapor deposited thin indium film after vacuum vapor deposition in Comparative Example 1 (at a magnification of ×30,000)
Figure 11:
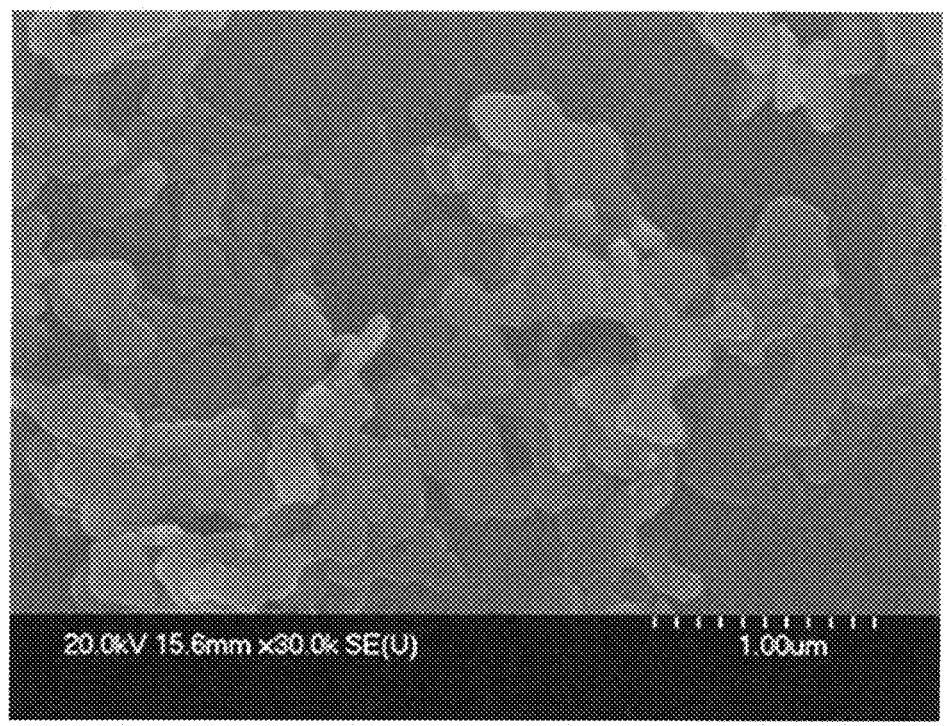
FIG. 11 is a SEM image of thin leaf-like indium particles obtained in Comparative Example 1 (at a magnification of ×30,000)

A thin leaf-like indium particle dispersion liquid of Comparative Example 1 was obtained in the same manner as in Example 1, except that unlike in Example 1, a vapor-deposited thin indium film having an average vapor deposition thickness of 66 nm was formed at a vapor deposition rate of 30 nm/sec. A SEM image of the vapor-deposited thin indium film (at a magnification of ×30,000) is illustrated in FIG. 6. A SEM image of the obtained thin leaf-like indium particles (at a magnification of ×30,000) is illustrated in FIG. 11.

Comparative Example 2

A solution containing cellulose acetate butyrate (CAB) (5% by mass) was coated on a polyethylene terephthalate (PET) film having an average thickness of 12 micrometers by a gravure coating method, and dried at from 110 degrees C. through 120 degrees C., to form a release layer. The coating amount of cellulose acetate butyrate (CAB) was 0.06 g/m$^2$±0.01 g/m$^2$. A vapor deposited thin aluminum film having an average vapor deposition thickness of 40 nm was formed on the release layer at a vapor deposition rate of 40 nm/sec by a high frequency induction heating-vacuum vapor deposition method.

Next, propylene glycol monomethyl ether (PM) was sprayed on the PET film surface on which the release layer and the thin aluminum film were formed, to dissolve the release layer, and the vapor-deposited thin aluminum film was scraped off with a doctor blade. The obtained aluminum particles had a thin leaf-like shape.

Next, using a pulverizer, the obtained mixture of the aluminum particles and propylene glycol monomethyl ether (PM) was pulverized to an average particle diameter of 1 micrometer.

Figure 12:
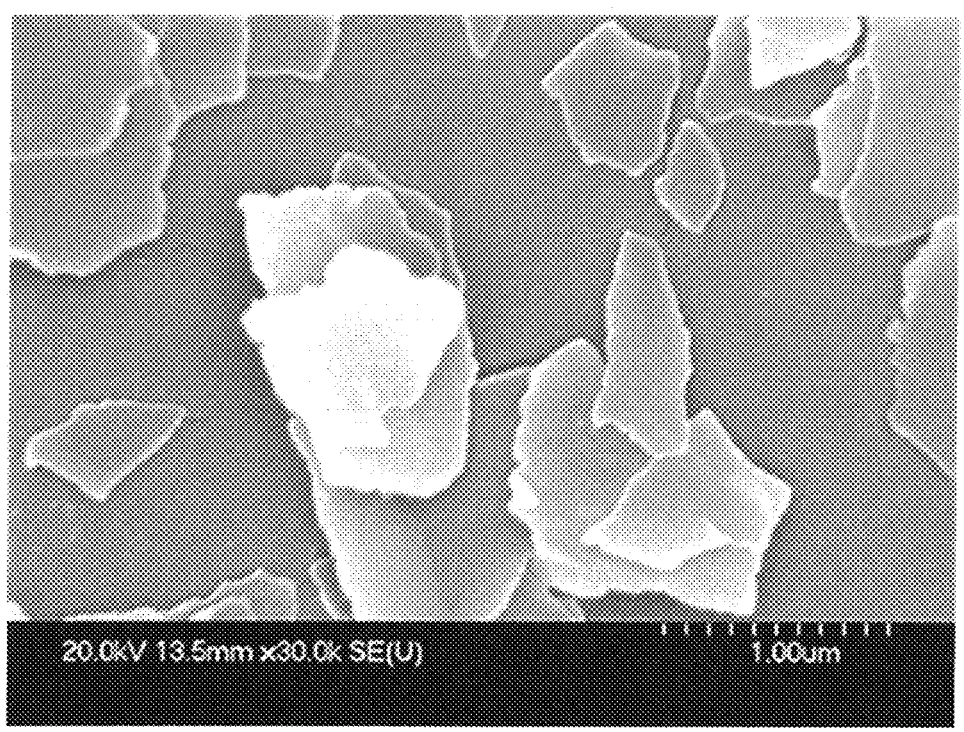
FIG. 12 is a SEM image of thin leaf-like aluminum particles obtained in Comparative Example 2 (at a magnification of ×30,000)
Figure 13:
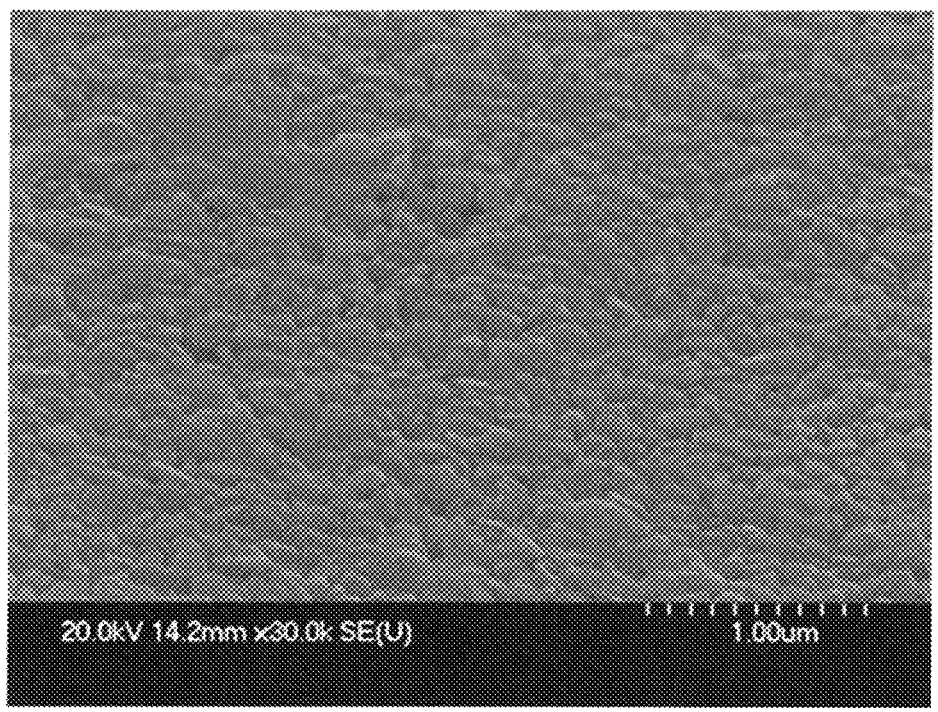
FIG. 13 is a SEM image of a coating film containing thin leaf-like indium particles of Example 1 (at a magnification of ×30,000)
Figure 14:
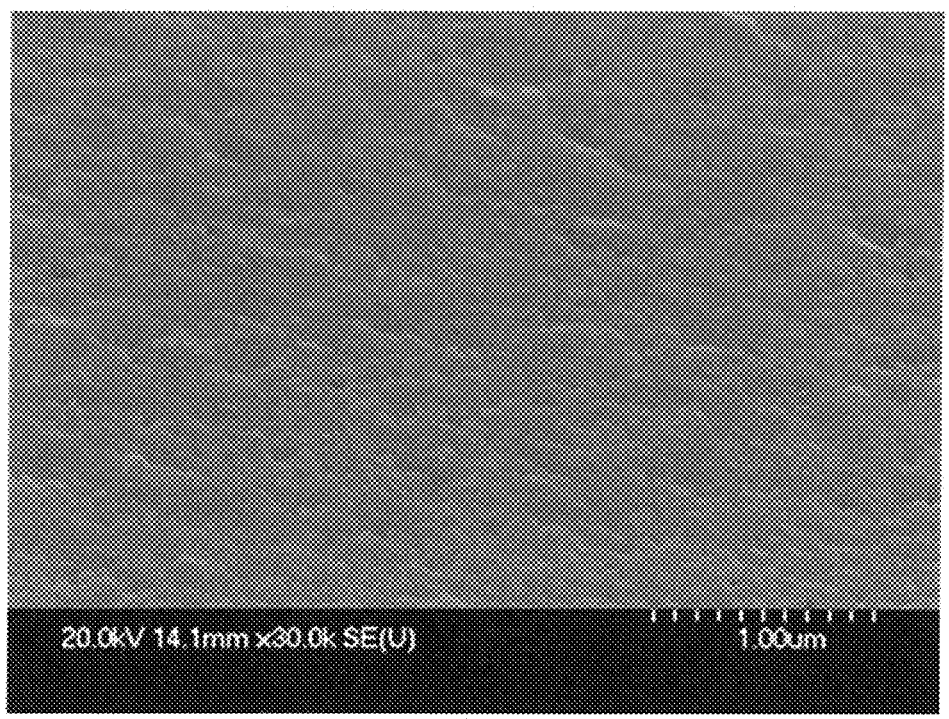
FIG. 14 is a SEM image of a coating film containing thin leaf-like indium particles of Example 2 (at a magnification of ×30,000)
Figure 15:
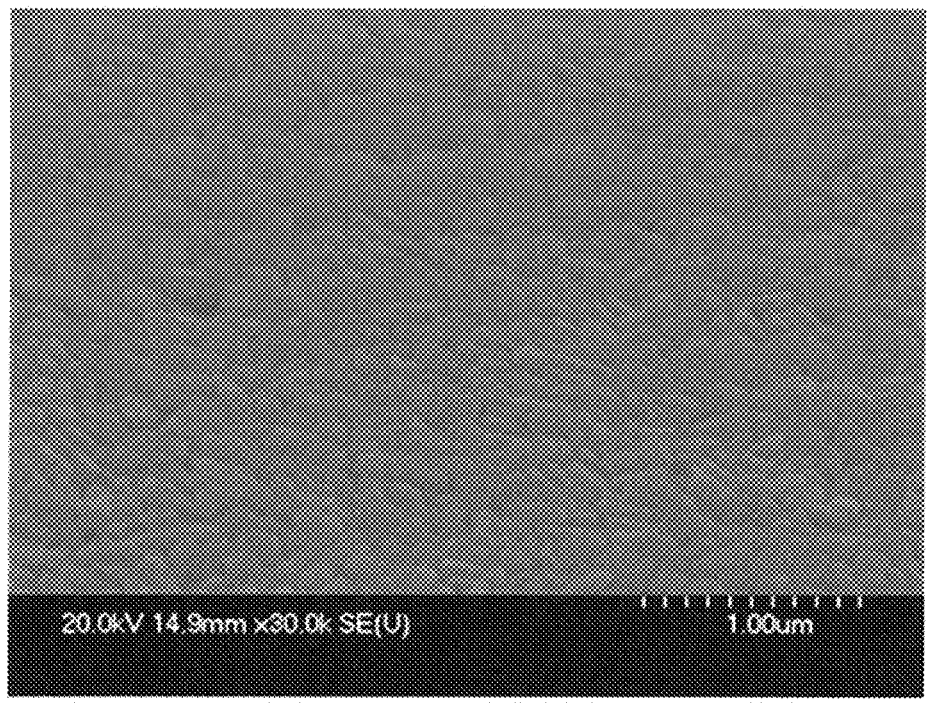
FIG. 15 is a SEM image of a coating film containing thin leaf-like indium particles of Example 3 (at a magnification of ×30,000)
Figure 16:
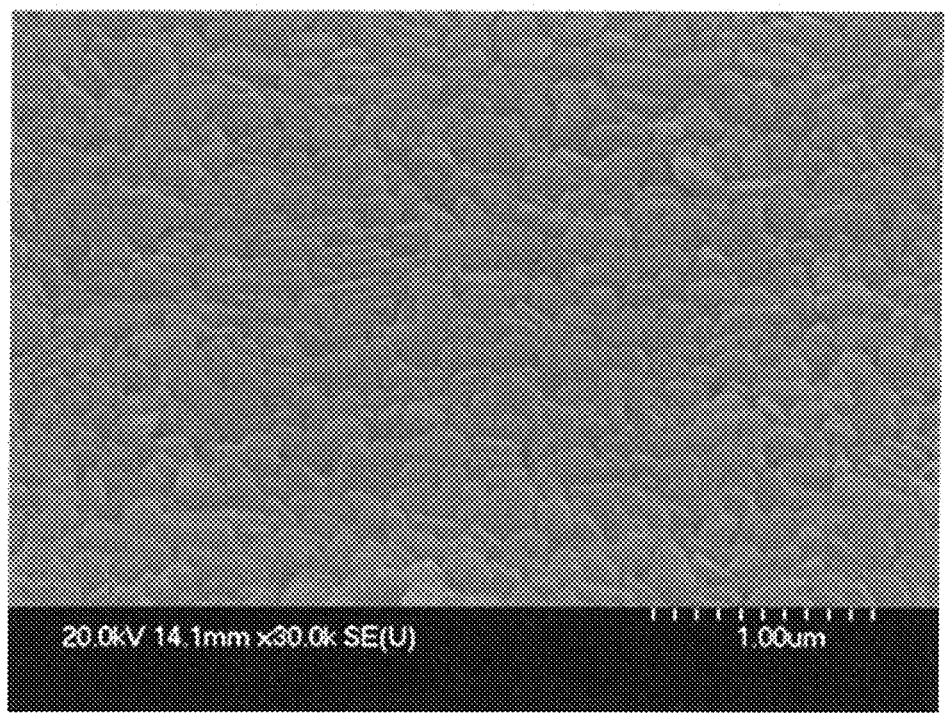
FIG. 16 is a SEM image of a coating film containing thin leaf-like indium particles of Example 4 (at a magnification of ×30,000)
Figure 17:
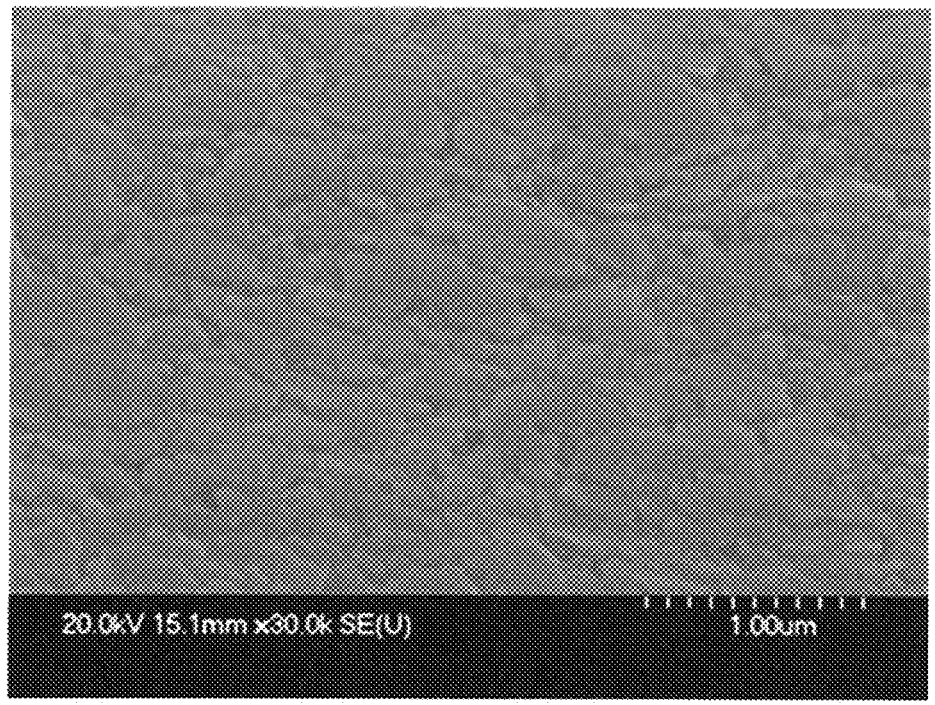
FIG. 17 is a SEM image of a coating film containing thin leaf-like indium particles of Comparative Example 1 (at a magnification of ×30,000)
Figure 18:
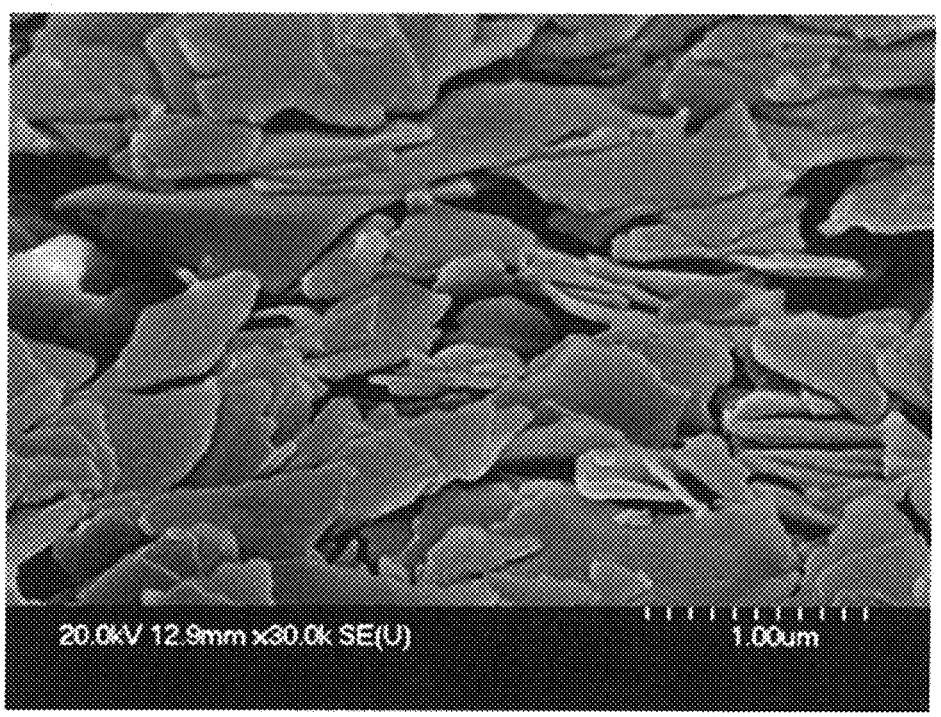
FIG. 18 is a SEM image of a coating film containing thin leaf-like aluminum particles of Comparative Example 2 (at a magnification of ×30,000)
Figure 19:
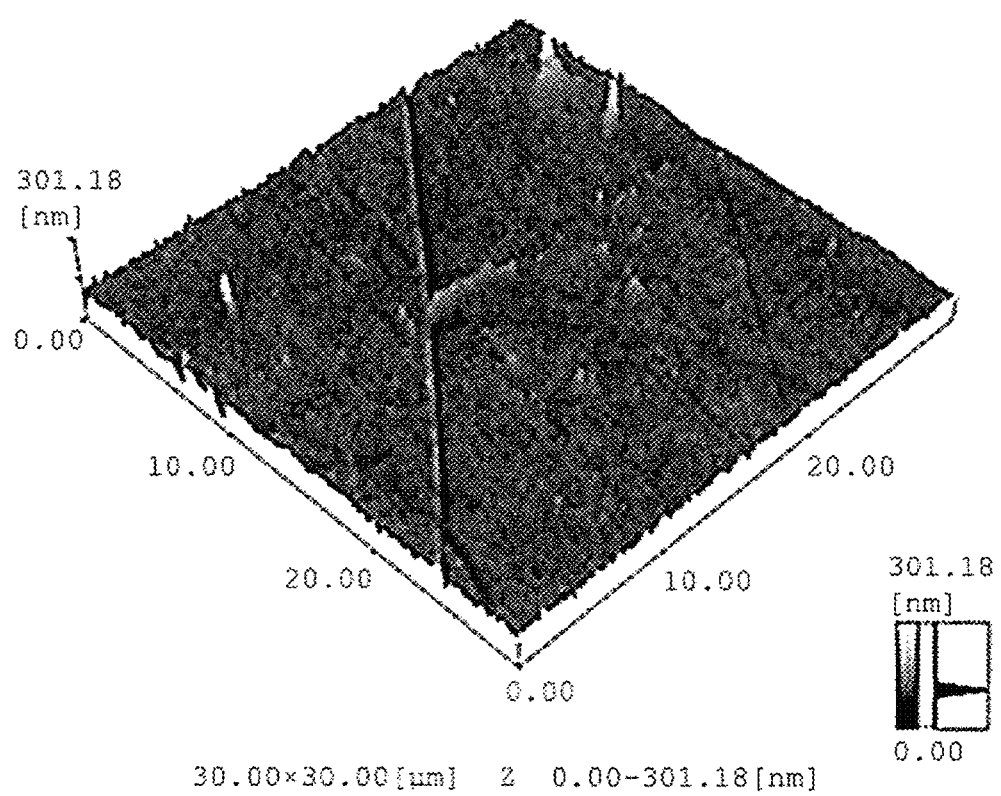
FIG. 19 is a graph plotting a result of AFM measurement of a coating film containing thin leaf-like indium particles of Example 1.
Figure 20:
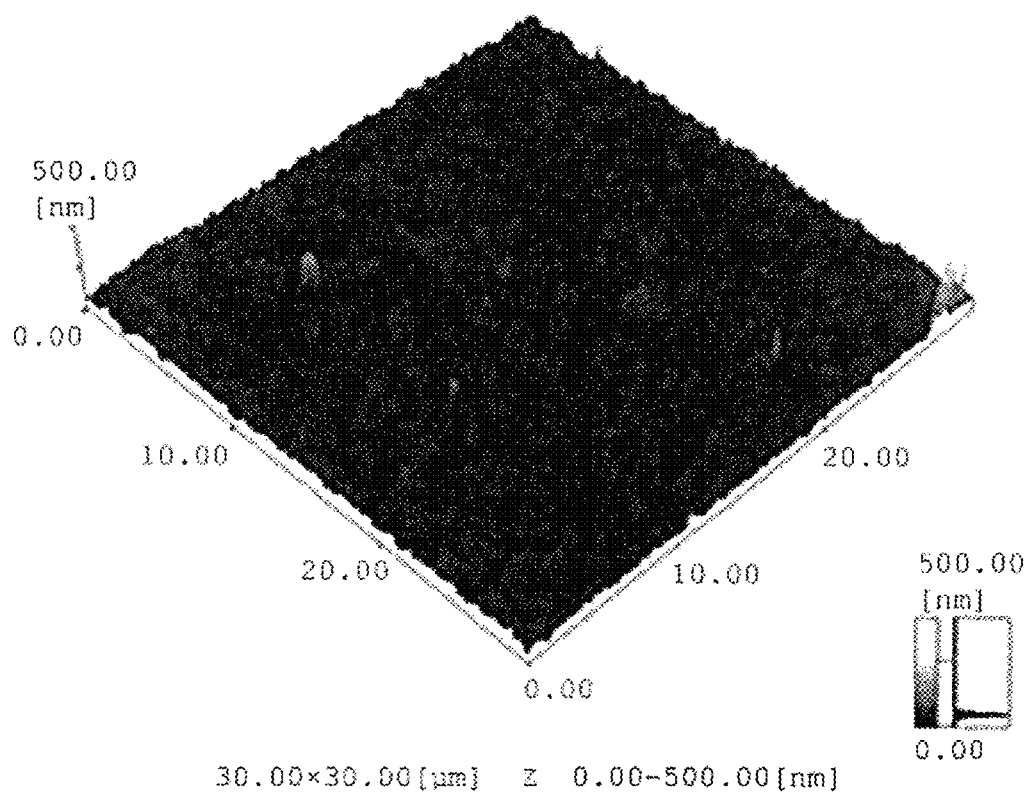
FIG. 20 is a graph plotting a result of AFM measurement of a coating film containing thin leaf-like indium particles of Example 2.
Figure 21:
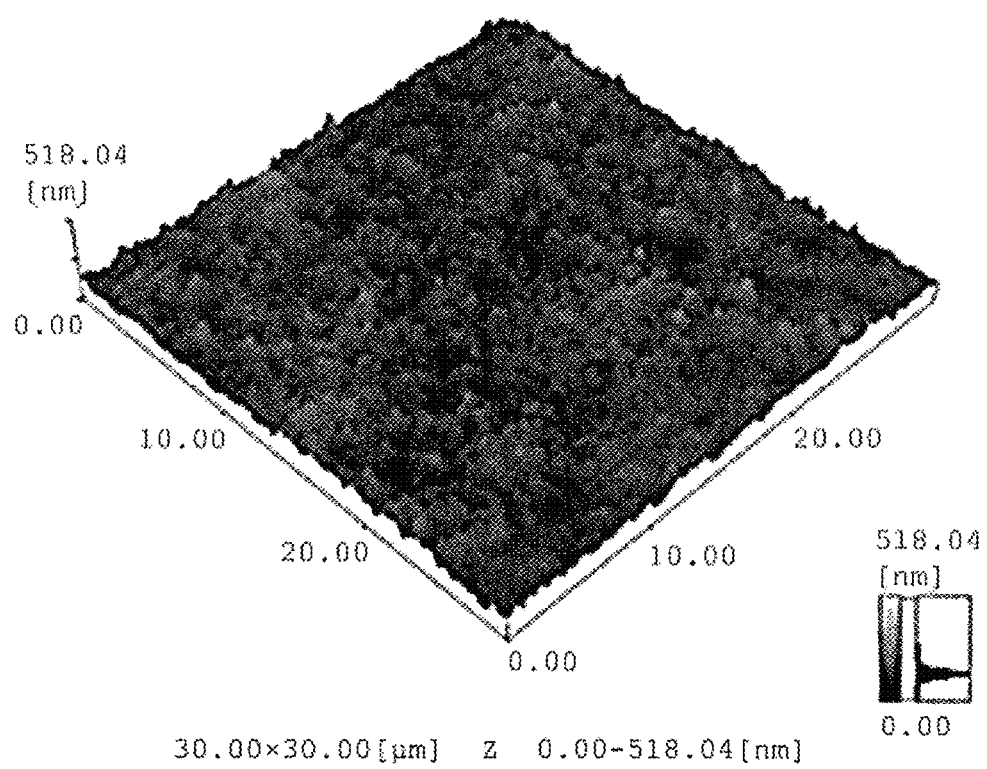
FIG. 21 is a graph plotting a result of AFM measurement of a coating film containing thin leaf-like indium particles of Example 3.
Figure 22:
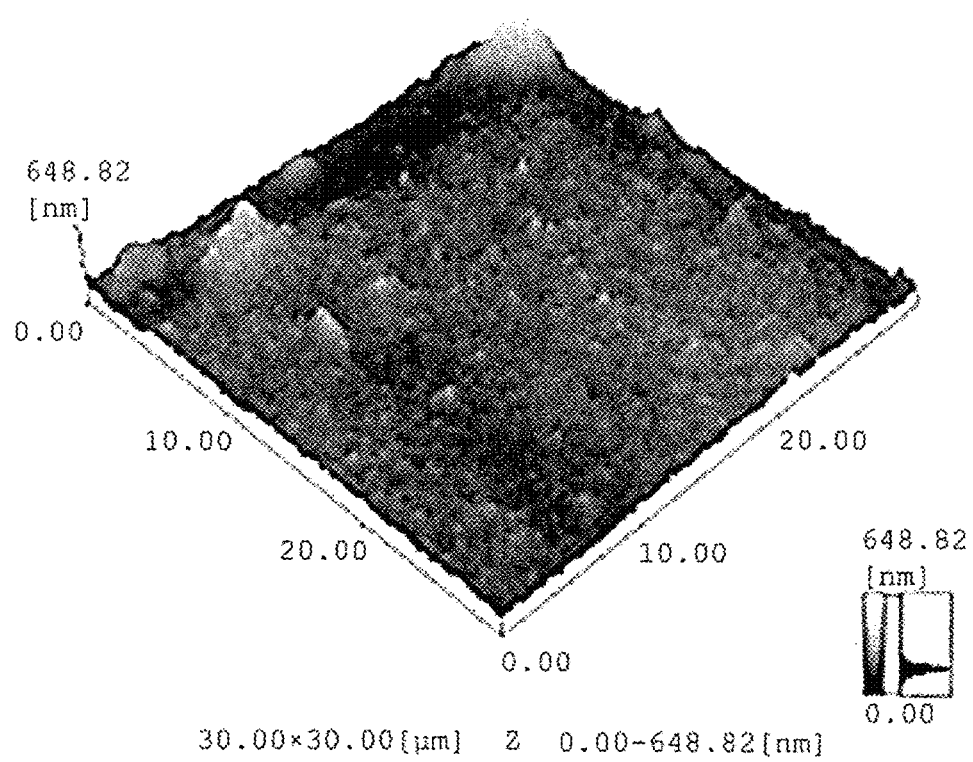
FIG. 22 is a graph plotting a result of AFM measurement of a coating film containing thin leaf-like indium particles of Example 4.
Figure 23:
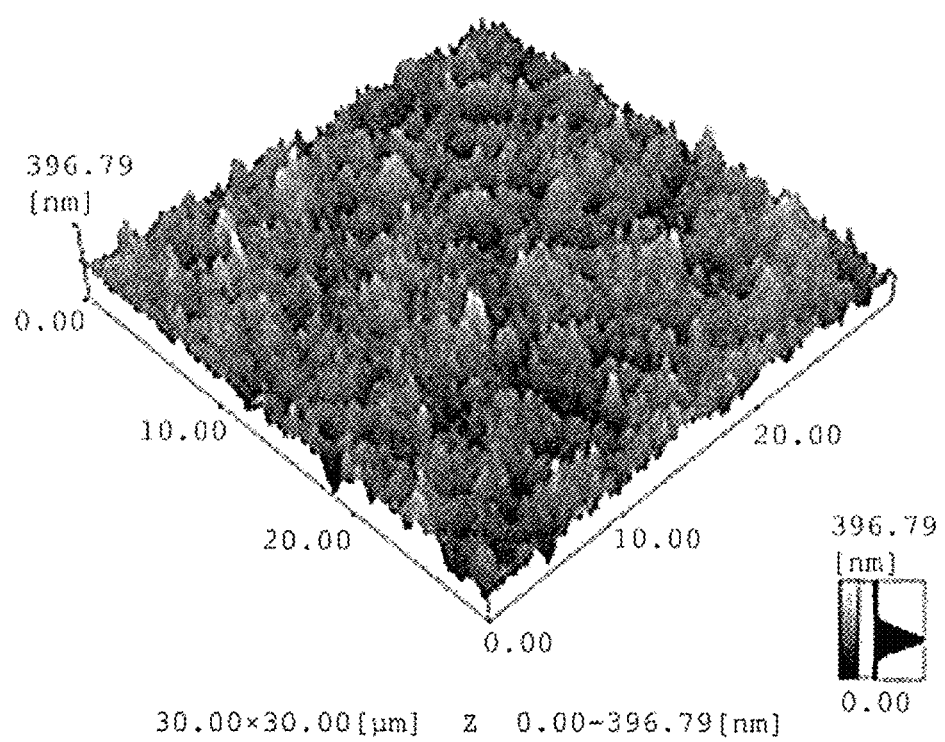
FIG. 23 is a graph plotting a result of AFM measurement of a coating film containing thin leaf-like indium particles of Comparative Example 1.
Figure 24:
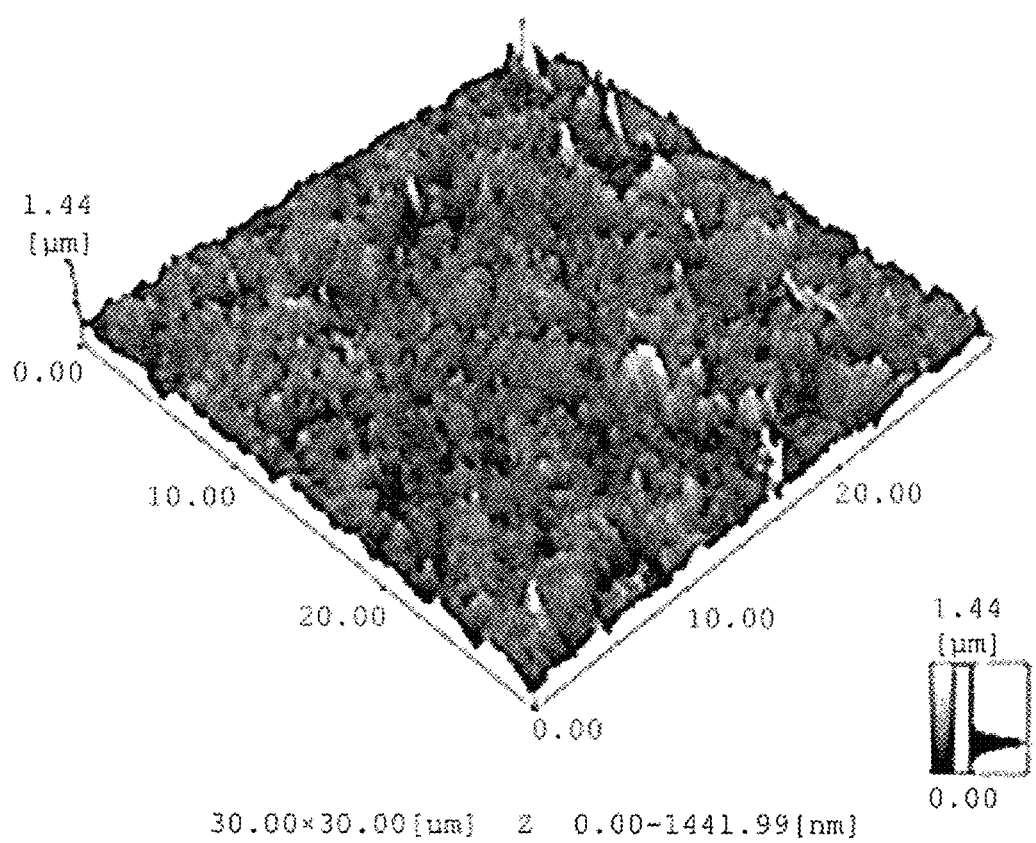
FIG. 24 is a graph plotting a result of AFM measurement of a coating film containing thin leaf-like aluminum particles of Comparative Example 2.

Aluminum particles were recovered from the obtained aluminum particles using a centrifuge, and the recovered aluminum particles were newly dispersed in PM at a solid concentration of 10% by mass, to obtain a thin leaf-like aluminum particle dispersion liquid of Comparative Example 2. A SEM image of the obtained thin leaf-like aluminum particles (at a magnification of ×30,000) is illustrated in FIG. 12.

<Formation of Coating Film>

The respective obtained metal particles were dispersed in a dispersion solvent (propylene glycol monomethyl ether (PM) and water at a mass ratio of 1:1) and adjusted to a solid concentration of 2.5% by mass, to prepare metal particle dispersion liquids.

Using a spin coater available from Mikasa Co., Ltd. (MS-A150), a coating film of each metal particle dispersion liquid was formed on a glass substrate at a rotation speed of 500 rpm.

SEM images of the coating films of Examples 1 to 4 and Comparative Examples 1 and 2 (at a magnification of ×30,000) are illustrated in FIG. 13 to FIG. 18.

Next, various properties of each of the obtained metal particles and coating films were evaluated in the manners described below. The results are presented in Table 1 to Table 3.

[Cumulative 50% Volume-Based Particle Diameter ($D_{50}$), Particle Size Distribution, Particle Diameter Peak Top, and Volume Ratio of Metal Particles]

As regards the cumulative 50% volume-based particle diameter ($D_{50}$) of the produced indium particles, a sample containing the metal particles was delivered to a measuring cell while being stirred with a stirrer in ethanol (product name: EKINEN F-1, available from Japan Alcohol Trading Co., Ltd., with a refractive index of 1.360) as a dispersion medium, to measure the volume-based particle size distribution of the metal particles with a laser diffraction/scattering particle size analyzer (instrument name: LASER MICRON SIZER LMS-2000E, available from Seishin Enterprise Co., Ltd., a wet dispersing unit), to obtain the volume at each peak and calculate the volume ratio (V1/V2)×100.

<Peak Area and Area Ratio>

For the respective metal particles, the definite integral of the particle size distribution graph representing particle diameter on X axis and volume % on Y axis was approximated with the sum total of the trapezoids at the respective subintervals. That is, with each point on the graph defined as $(x_i, y_i) 0 \leq i \leq n$, the area of each peak was obtained according to $S=\Sigma \frac{1}{2} \times \{y(i)+y(i+1)\} \times \{\log(x(i+1))-\log(xi)\}$, and an area ratio (S1/S2)×100 was calculated.

<Gloss Value>

The specular gloss of each coating film was measured. The gloss value was measured with a gloss meter (available from Nippon Denshoku Industries Co., Ltd., VG-7000) according to a collimated light method compliant with OS Z8741 "specular gloss measuring method" at an incident angle of 20° (Gs20°) and at an incident angle of 60° (Gs60°).

<Hue (L* Value, a* Value, and b* Value)>

Using an ultraviolet-visible-near infrared spectrophotometer (available from Shimadzu Corporation, SOLID SPEC-3700), the hue of each coating film was calculated based on a reflection spectrum at an incident angle of 5° in a wavelength range of from 300 nm through 800 nm.

<Surface Roughness (Ra)>

The arithmetic mean surface roughness Ra of each coating film in a range of 30 micrometers×30 micrometers was calculated with a scanning probe microscope (AFM, available from Shimadzu Corporation, SPM-9600). The AFM results of the coating films of Examples 1 to 4 and Comparative Examples 1 and 2 are illustrated in FIG. 19 to FIG. 24.

<Storage Stability>

The respective produced metal particles were dispersed in a dispersion solvent (PM (propylene glycol monomethyl ether) and water at a mass ratio of 1:1), to prepare metal particle dispersion liquids adjusted at a solid concentration of 2.5% by mass. The obtained metal particle dispersion liquids were each poured into a glass bottle having a capacity of 30 mL (standard bottle No. 5, available from As One Corporation), tightly sealed, and left to stand still in an environment of 60 degrees C. for 30 days, to measure the appearance and differential pressure, to evaluate storage stability according to the criteria described below. The "differential pressure" was calculated according to (internal pressure in the glass bottle after test)–(atmospheric pressure).

[Evaluation Criteria]

A: There was no appearance change and the differential pressure was lower than 5 kPa.

B: There was an appearance change, and the differential pressure was 5 kPa or higher.

TABLE 1

| | Vapor-deposited metal | Average vapor deposition thickness (nm) | Cumulative 50% volume-based particle diameter $D_{60}$ (micrometer) | Particle diameter P1 (micrometer) at first peak | Particle diameter P2 (micrometer) at second peak | P2/P1 |
|---|---|---|---|---|---|---|
| Ex. 1 | Indium | 37 | 0.14 | 0.072 | 0.43 | 6.0 |
| Ex. 2 | | 43 | 0.31 | 0.072 | 0.48 | 6.6 |
| Ex. 3 | | 51 | 0.49 | 0.072 | 0.58 | 8.1 |
| Ex. 4 | | 55 | 0.60 | 0.072 | 0.71 | 9.8 |
| Comp. Ex. 1 | | 66 | 0.78 | 0.080 | 0.78 | 9.8 |
| Comp. Ex. 2 | Aluminum | 40 | 1.16 | | | |

TABLE 2

| | Volume V1 (%) at first peak | Volume V2 (%) at second peak | (V1/V2) × 100 (%) | Area S1 (%) at first peak | Area S2 (%) at second peak | (S1/S2) × 100 (%) |
|---|---|---|---|---|---|---|
| Ex. 1 | 5.32 | 4.89 | 108.8 | 53.8 | 46.2 | 116.5 |
| Ex. 2 | 4.48 | 6.04 | 74.2 | 43.0 | 57.0 | 75.4 |
| Ex. 3 | 3.05 | 6.71 | 45.5 | 27.5 | 72.5 | 37.9 |
| Ex. 4 | 2.75 | 7.12 | 38.6 | 25.0 | 75.0 | 33.3 |
| Comp. Ex. 1 | 1.28 | 6.23 | 20.5 | 12.3 | 87.7 | 14.0 |
| Comp. Ex. 2 | | | | | | |

TABLE 3

| | Optical properties | | | | Surface | Storage stability | |
|---|---|---|---|---|---|---|---|
| | Gloss value | | Hue | | | roughness | Differential | |
| | Gs20° | Gs60° | L* value | a* value | b* value | Ra (nm) | Appearance | pressure | Evaluation |
| Ex. 1 | 971 | 439 | 68.57 | −3.41 | −0.53 | 9.1 | No change | Lower than 5 kPa | A |

TABLE 3-continued

|  | Optical properties | | | | | Surface | | Storage stability | |
|---|---|---|---|---|---|---|---|---|---|
|  | Gloss value | | L* | a* | b* | roughness | | Differential | |
|  | Gs20° | Gs60° | value | value | value | Ra (nm) | Appearance | pressure | Evaluation |
| Ex. 2 | 929 | 476 | 70.72 | −2.01 | 5.89 | 13.8 | No change | Lower than 5 kPa | A |
| Ex. 3 | 585 | 406 | 67.39 | −0.48 | 7.90 | 19.1 | No change | Lower than 5 kPa | A |
| Ex. 4 | 442 | 357 | 65.00 | −0.87 | 7.21 | 24.0 | No change | Lower than 5 kPa | A |
| Comp. Ex. 1 | 289 | 302 | 54.20 | 0.37 | 9.25 | 35.7 | No change | Lower than 5 kPa | A |
| Comp. Ex. 2 | 70 | 175 | 41.53 | 0.59 | 8.76 | 69.4 | whitened | 5 kPa or higher | B |

What is claimed is:

1. Thin leaf-like indium particles,
the thin leaf-like indium particles having a first peak and a second peak at a greater particle diameter than a particle diameter at which the first peak appears in a volume-based particle size distribution representing a relationship between particle diameters of indium particles and ratios by volume of the indium particles at the particle diameters,
a volume V1 of the indium particles at the first peak and a volume V2 of the indium particles at the second peak satisfying a formula $(V1/V2) \times 100 \geq 25\%$,
wherein a cumulative 50% volume-based particle diameter $D_{50}$ of the indium particles is 0.14 micrometers or greater and 0.70 micrometers or less, and wherein an average thickness of the indium particles is 37 nm or greater and 60 nm or less.

2. The thin leaf-like indium particles according to claim 1, wherein a particle diameter P1 of the indium particles at the first peak and a particle diameter P2 of the indium particles at the second peak satisfy a formula $P2/P1 \leq 12$ in the volume-based particle size distribution representing a relationship between particle diameters of the indium particles and ratios by volume of the indium particles at the particle diameters.

3. The thin leaf-like indium particles according to claim 2, wherein the particle diameter P2 of the indium particles at the second peak is 0.75 micrometers or less.

4. The thin leaf-like indium particles according to claim 1, wherein the thin leaf-like indium particles comprise an organic material layer on at least part of surfaces of the thin leaf-like indium particles.

5. A glitter pigment, comprising:
the thin leaf-like indium particles according to claim 1.

6. A water-based paint, comprising:
water; and
the thin leaf-like indium particles according to claim 1.

7. A coating film, comprising:
thin leaf-like indium particles according to claim 1,
wherein the coating film has a surface roughness Ra of 30 nm or less.

8. The coating film according to claim 7,
wherein the coating film has a gloss value of 300 or greater at an incident angle of 20°, and
wherein the coating film has a gloss value of 320 or greater at an incident angle of 60°.

9. The coating film according to claim 7,
wherein the coating film has L* value of 60 or greater, a* value of −5 or greater but 0.5 or less, and b* value of −3 or greater but 10 or less in a CIE Lab color system.

* * * * *